(12) United States Patent
Mayer et al.

(10) Patent No.: US 7,795,998 B2
(45) Date of Patent: Sep. 14, 2010

(54) RESONATOR FUNCTIONING WITH ACOUSTIC VOLUME WAVES

(75) Inventors: Markus Mayer, Taufkirchen (DE); Wolfgang Sauer, Taufkirchen (DE); Edgar Schmidhammer, Stein (DE); Habbo Heinze, Weil im Schönbuch (DE); Andreas Link, Munich (DE); Christoph Eggs, Rattenkirchen (DE)

(73) Assignee: Epcos AG, Munich (DE)

( * ) Notice: Subject to any disclaimer, the term of this patent is extended or adjusted under 35 U.S.C. 154(b) by 177 days.

(21) Appl. No.: 12/158,210

(22) PCT Filed: Dec. 18, 2006

(86) PCT No.: PCT/DE2006/002270

§ 371 (c)(1),
(2), (4) Date: Jul. 22, 2008

(87) PCT Pub. No.: WO2007/071233

PCT Pub. Date: Jun. 28, 2007

(65) Prior Publication Data

US 2009/0002098 A1 Jan. 1, 2009

(30) Foreign Application Priority Data

Dec. 21, 2005 (DE) .................. 10 2005 061 344

(51) Int. Cl.
*H03H 9/05* (2006.01)
*H03H 9/15* (2006.01)
*H03H 9/54* (2006.01)

(52) U.S. Cl. ....................... 333/187; 310/335
(58) Field of Classification Search ......... 333/187–189; 310/322, 334, 335
See application file for complete search history.

(56) References Cited

U.S. PATENT DOCUMENTS

2004/0140869 A1 7/2004 Marksteiner et al.
2007/0199185 A1* 8/2007 Thalhammer et al. ...... 29/25.35

FOREIGN PATENT DOCUMENTS

| EP | 1 120 910 | 8/2001 |
| WO | WO 01/06647 | 1/2001 |
| WO | WO 2005/096494 | 10/2005 |

OTHER PUBLICATIONS

English translation of written opinion for PCT/DE2006/002270.
Milsom et al "Simulation of Second Order Effects in SBAR and FBAR" Second Int'l Symp. on Acoustic Wave Devices for Future Mobile Comm. Systems, Mar. 3-5, 2004, pp. 1-12 XP 002425750.

(Continued)

*Primary Examiner*—Barbara Summons
(74) *Attorney, Agent, or Firm*—Fish & Richardson P.C.

(57) ABSTRACT

A resonator operating with bulk acoustic waves includes a resonator stack. The resonator stack includes a resonator area configured to allow propagation of an acoustic main mode and an acoustic secondary mode. The resonator stack also includes an acoustic mirror that includes a first partial mirror for locking in the acoustic main mode in the resonator area and a second partial mirror for locking in the secondary mode in a resonator space.

26 Claims, 10 Drawing Sheets

OTHER PUBLICATIONS

Aigner R. "MEMS in FR Filter Applications: Thin-film Bulk Acoustic Wave Technology" Sensors-Update 12, H. Baltes (Ed.) Wiley-VCH, 2003 pp. 175-210.

Fattinger et al "Optimization of Acoustic Dispersion for high Performance Thin Film BAW Resonators" IEEE Ultrasonics Symp. 2005, Sep. 18-21, 2005, pp. 1175-1178, XP 010899034.

Meeker at al "Guided Wave Propagation in elongated Cylinders and Plates" Physical Acoustics, Principles and Methods, Band 1A, New York 1963.

International Search Report for PCT/DE2006/002270.

Written Opinion for PCT/DE2006/002270.

* cited by examiner

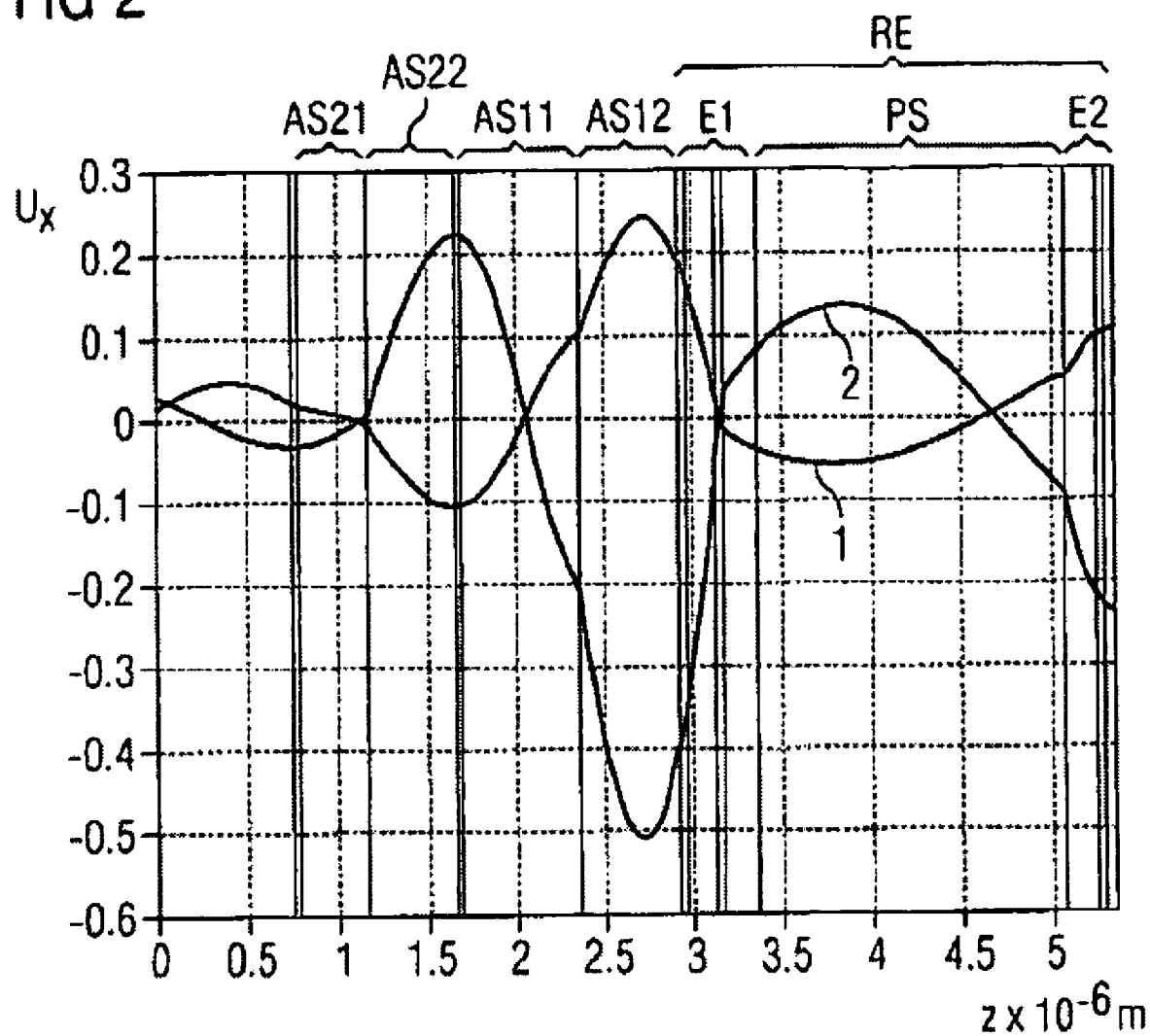

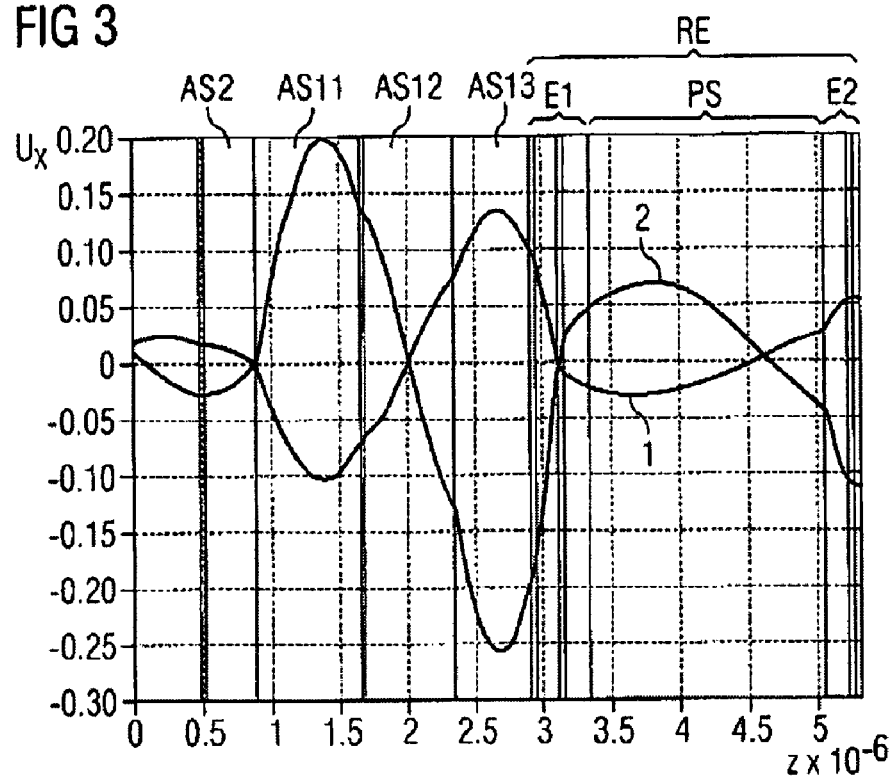
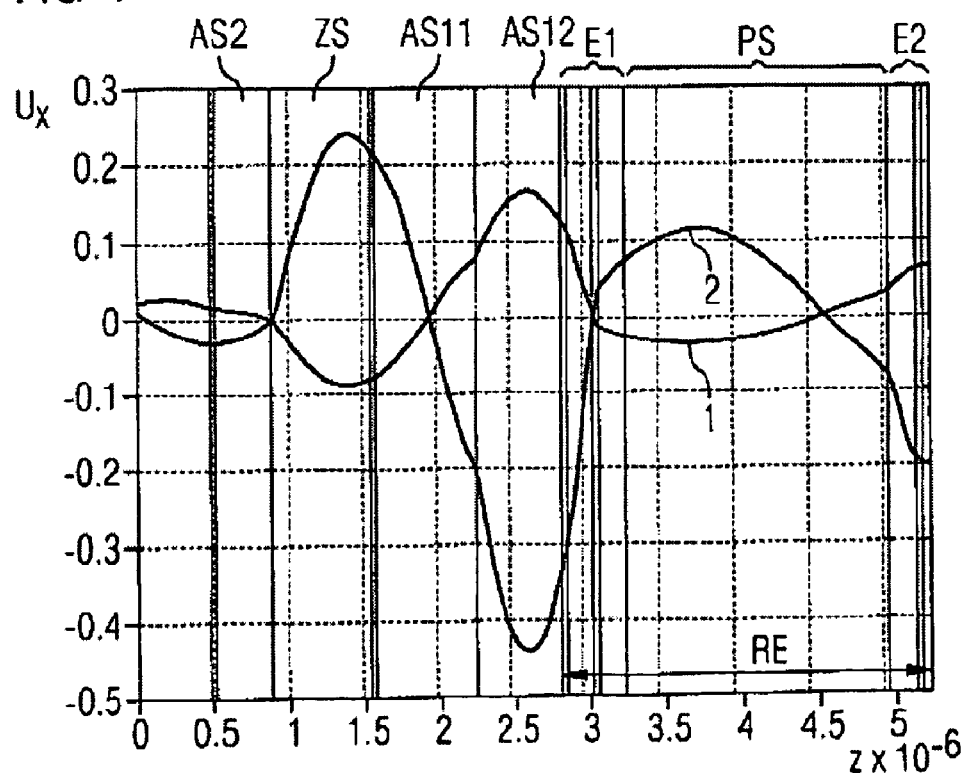

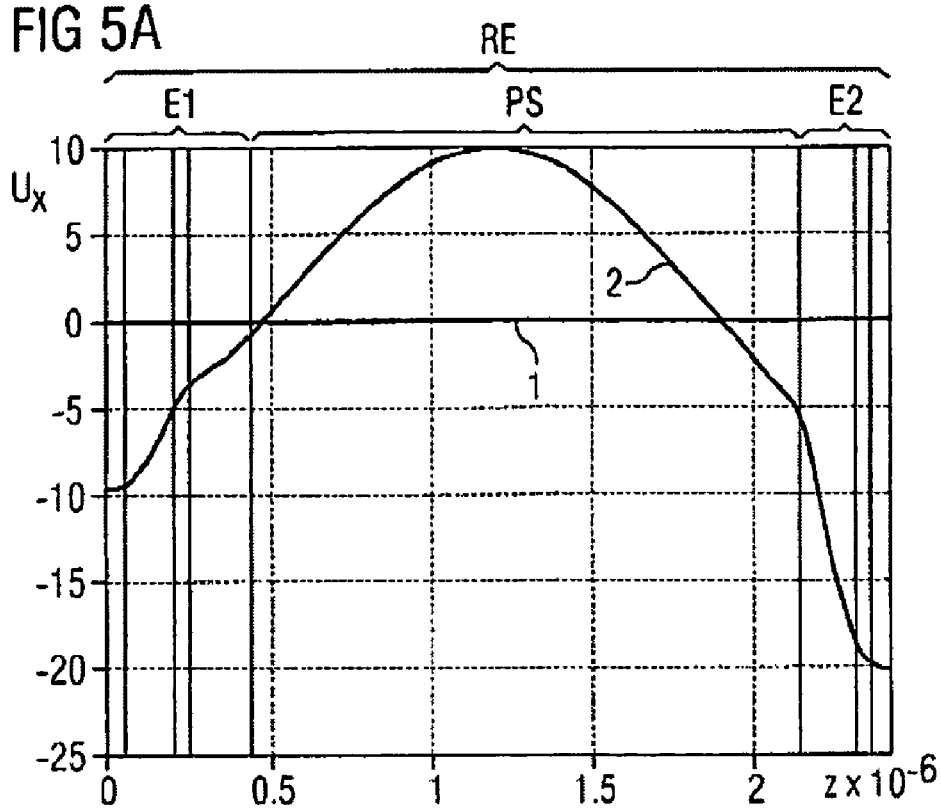
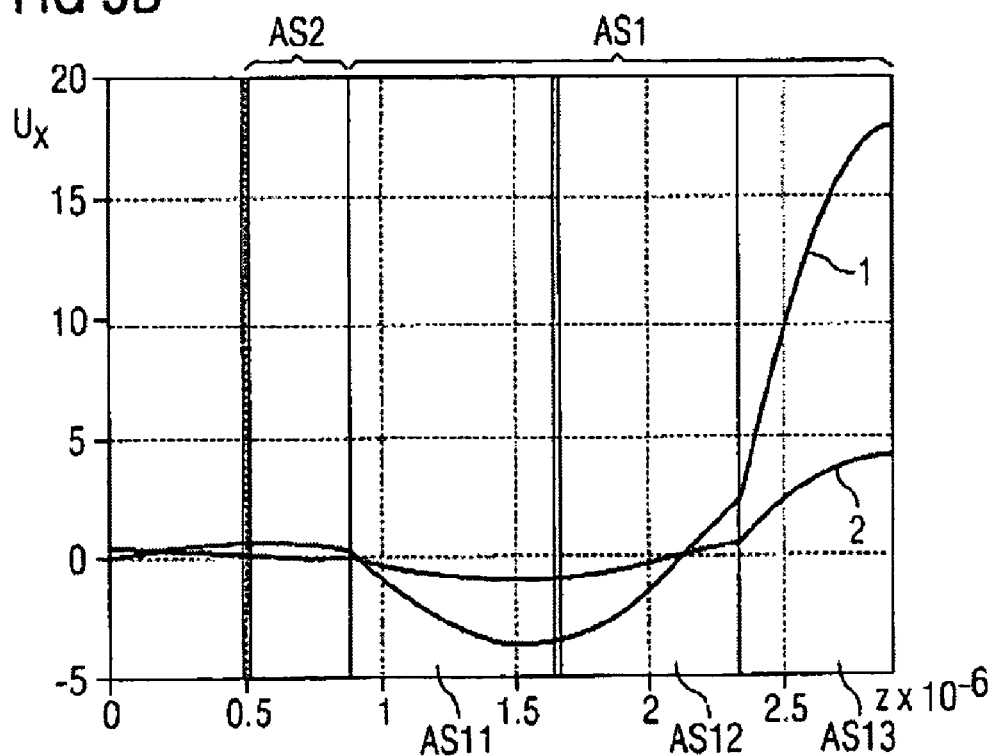

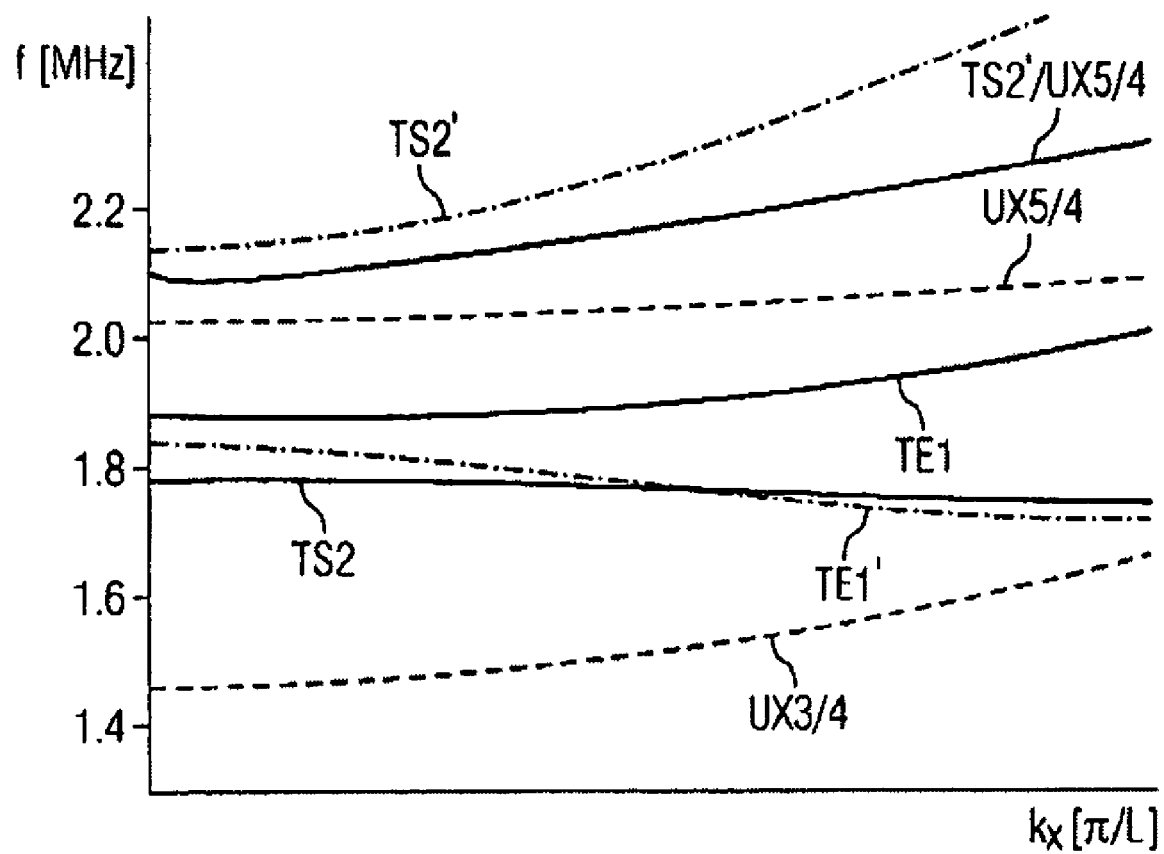

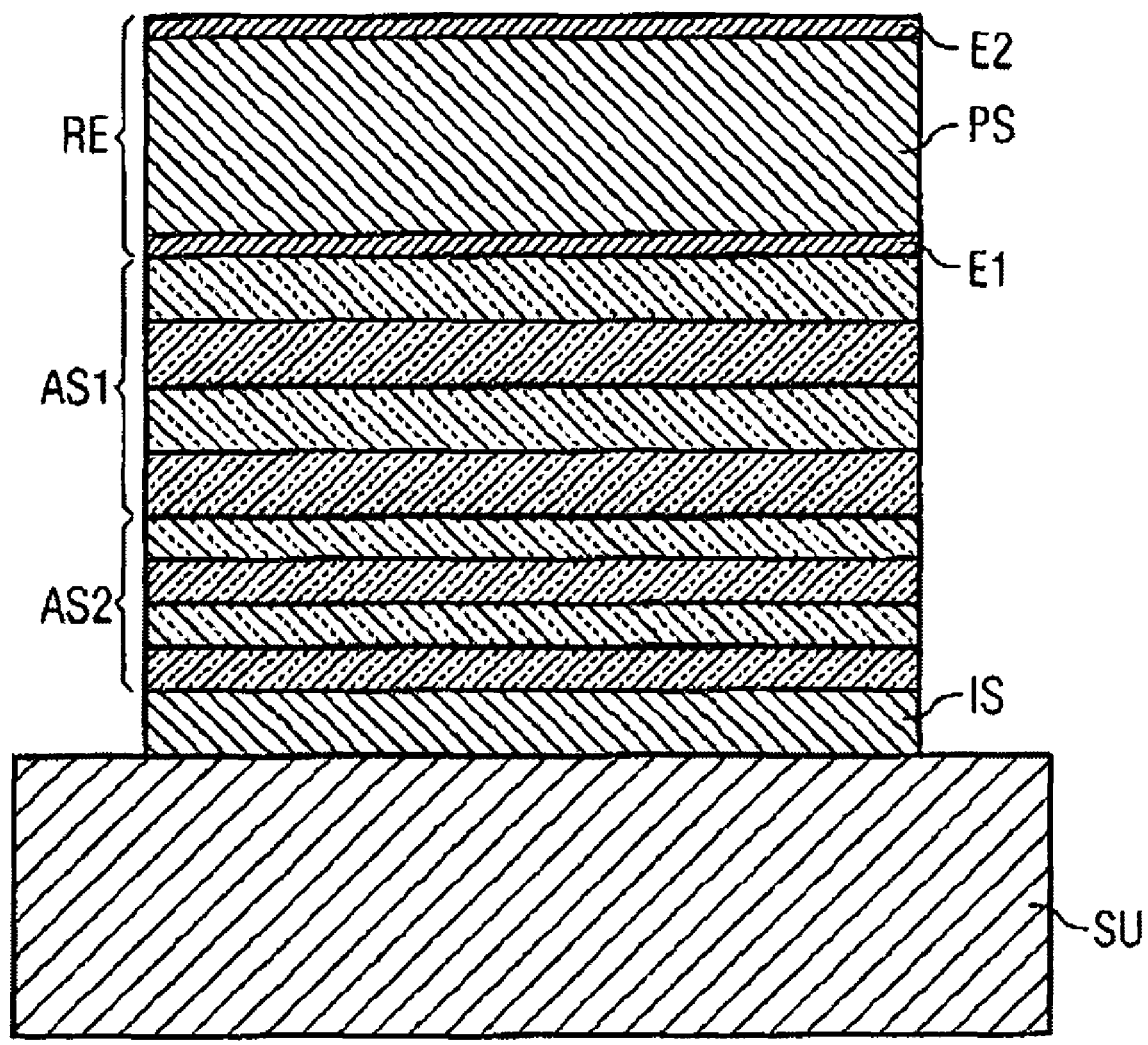

RESONATOR FUNCTIONING WITH ACOUSTIC VOLUME WAVES

CROSS REFERENCE TO RELATED APPLICATIONS

Pursuant to 35 USC §120, this application claims the benefit PCT/DE2006/002270 filed Dec. 18, 2006 which claims the benefit of German Patent Application No. 102005061344.6 filed Dec. 21, 2005. Each of these applications is incorporated by reference in its entirety.

BACKGROUND

From the publication US 2004/0140689 A1, a BAW resonator with an acoustic mirror is known, whose permittivity to a longitudinal wave and a shear wave is below −15 dB. BAW stands for bulk acoustic wave.

SUMMARY

The problem to be solved is to indicate a BAW resonator that is suitable for high-frequency filters with low insertion loss, high edge steepness, and wide bandwidth.

A resonator operating with bulk acoustic waves is indicated, which comprises a resonator area and an acoustic mirror. In the resonator area, an acoustic main mode is capable of propagation at the resonance frequency of the resonator in the vertical direction (=longitudinal direction). Moreover, in the resonator stack in the vertical direction, a localized secondary mode is capable of propagation at the resonance frequency of this secondary mode. The mirror comprises a first partial mirror, provided to lock in the main mode in the resonator area, and a second partial mirror, where the first partial mirror is located between the resonator area and the second partial mirror. A resonance space for the secondary mode is provided above the second partial mirror; it comprises the first partial mirror and the resonator area. This resonance space is suitable for locating the secondary mode at the resonance frequency of the resonator. In this way, it is possible to reduce the energy losses associated with the secondary mode and to effect a high resonator Q factor. Thus, a relatively high bandwidth can be attained in a filter comprising such resonators.

Advantageous implementations of the resonator stack are explained below.

Dispersion of a wave mode is the designation for the dependence of the resonance frequency f of this mode on the wave number k. Normal dispersion is characterized by a monotonically increasing curve f(k). Anomalous dispersion is characterized by a monotonous falling curve f(k).

The resonator area forms a resonance space for the main mode. The resonator area preferably comprises a first electrode, a second electrode, and a piezoelectric layer located between them.

The secondary mode, which can be excited in the resonator area and which is capable of propagation in the resonance space located above the second partial mirror, is formed at a certain resonance frequency in an insulated resonator area, in which three wave antinodes of this secondary mode appear. An insulated resonator area is understood to be the resonator area without the acoustic mirror—that is, if, in the propagation direction of the wave, it is adjacent to air on both sides.

A wave antinode of a wave mode is understood to be the maximum of the excursion magnitude of this mode. A wave node of a wave mode is understood to be a zero point of the excursion magnitude of this mode.

A range of the excursion function which extends between a wave antinode and the wave node following it is designated as a quarter-wave. A section of the standing wave, which extends between two wave antinodes that follow one another is designated as a half-wave. In a layer stack consisting of different materials, the distance between the wave antinodes and nodes can be different from layer to layer. In this case, a half-wave is composed of two quarter-waves that follow one another with different lengths, and a whole wave is composed of four quarter-waves that follow one another with different lengths.

The resonance space provided for the secondary mode preferably extends between the upper interface of the second partial mirror—that is, the interface facing the first partial mirror—and the upper interface of the resonator area—that is, the interface turned away from the first partial mirror. The resonance space provided for the secondary mode is, above all, preferably formed by an implementation of the second partial mirror, explained below, in such a way that the acoustic thickness of the resonator area is between $¾ \lambda_s$ and $\lambda_s$, where $\lambda_s$ is the wavelength of the secondary mode.

Essentially two half-waves of the secondary mode are formed in the resonator area. Two half-waves comprise three wave antinodes and two wave nodes. There are either two or three wave antinodes of the secondary mode in the resonator area of the complete stack. The wave antinodes and nodes are counted downwards from the upper interface of the resonator area. The first wave antinode appears on the upper interface and the second wave antinode in the interior of the resonator area. The third wave antinode lies essentially on the lower interface of the resonator area—that is, directly on this interface or in its vicinity.

If the third wave antinode is adjusted far enough below this interface—that is, outside the resonator area—by the measures indicated in this publication, then a normal dispersion is attained, wherein the resonance frequency of the secondary mode lies below the resonance frequency of the main mode. The third wave antinode of the secondary mode is preferably shifted to the uppermost mirror layer of the first partial mirror.

A direction that runs vertically to the resonator layers and that runs parallel to the vertical axis of the stack is designated below as a longitudinal direction. A plane lying parallel to the resonator layers is designated as a lateral plane. A coordinate system is selected to describe the resonator stack in such a way that its z axis is directed along the vertical axis of the stack. A lateral direction is then in the x, y plane—that is, a lateral plane. Further below, the observation perhaps refers only to a lateral direction x but is readily applicable, however, to another lateral direction y or an arbitrary lateral direction.

The second partial mirror is used, in particular, to adjust a prespecified dispersion behavior of the wave modes that are capable of propagation in the resonator stack. A curve $f(k_{x,y})$, which describes the dependence of the resonance frequency f of a wave mode on the lateral wave number $k_{x,y}$, is designated as the dispersion behavior of a wave mode. A lateral component of the wave vector $(k_x, k_y, k_z)$ of a wave mode is designated as $k_x$ or $k_{x,y}$.

The main mode and the secondary mode are both bulk acoustic waves. The modes capable of propagation, in particular, the main mode and the secondary mode to be locked in, are to be understood as a standing wave in this publication. For this reason, the description can be limited to the real part of the wave functions without restriction of generality. The wave function is a function of the excursion of material toward a space direction.

The main mode is characterized in that essentially a half-wave is formed in the resonator area in the longitudinal direction. The secondary mode is characterized in that essentially two half-waves are formed in the resonator area in the longitudinal direction. This is called a λ/2-configuration.

Alternatively, the main mode can be characterized in that essentially a quarter-wave is formed in the resonator area in the longitudinal direction. The secondary mode is then characterized in that essentially a half-wave is formed in the resonator area. This is called a λ/4-configuration. Reference is made below to the λ/2-configuration. Nevertheless, all considerations can also be transferred to the λ/4-configuration without restriction of generality.

As a rule, the main mode of the resonator is the fundamental mode of a longitudinal wave. A longitudinal wave is understood to be a longitudinal polarized thickness vibration in which the excursion of the atoms takes place in the longitudinal direction.

The secondary mode to be locked in can be, for example, one of the modes of a shear wave. A shear weave is understood to mean a transversal polarized thickness vibration in which the excursion of the atoms takes place in the lateral plane.

For the main mode, $k_{x,y} \approx 0$, where $k_{x,y} \geq 0$. This means that the wave vector of the main mode is essentially oriented parallel to the vertical axis of the resonator stack. The half wavelength of the main mode is essentially equal to the thickness of the piezoelectric layer at the resonance frequency of the resonator.

As a result of the finite lateral cross section variable L of the resonator area, only lateral modes of the longitudinal wave with a discrete lateral wave number are capable of propagation, for which, as an approximation, $k_x = n\pi/L + k_{x,o}$, where n is a whole number with $n \geq 0$. $k_{x,o}$ is the lateral wave number of the main mode, which is the lateral mode with the smallest lateral wave number, where $0 < k_{x,o} < \pi/L$. The wave vector of the lateral modes deviates from the vertical axis of the resonator stack. These modes for $n \geq 1$ are interfering and lead to resonances which lie outside the main resonance of the resonator, but can be damped, for example, by a "lateral edge design," explained in the publication WO 01/06647 A1. In this way, the condition $k_{x,o} \approx 0$ is also essentially attained.

If the wave vector is directed along the vertical axis of the stack, then $k_x = 0$, where the longitudinal modes and the shear modes are decoupled from one another at all frequencies. If the wave vector deviates from the vertical axis, then $k_x < 0$ or $k_x > 0$, where the longitudinal modes and the shear modes can be more or less decoupled according to their relative frequency position. Consequently, the location of the shear modes above the second partial mirror and their coupling to the longitudinal modes (in the resonator area) can prevent energy being lost from the formed shear/longitudinal mixed modes by the acoustic mirror, which is permeable to the shear modes.

The dispersion behavior of the longitudinal mode can be influenced, purposefully and in the desired manner, by the interaction of the longitudinal mode and the shear mode. In particular, the addition of the second partial mirror to the first partial mirror makes it possible to reverse abnormal dispersion behavior of the longitudinal mode, which would be present in the resonator stack in the absence of the second partial mirror, to normal dispersion behavior. This is used to suppress disturbing lateral modes in a resonator stack with the already mentioned "lateral edge design."

The resonator area can thereby be subdivided in the XY plane into an active area, in which the excitation of the acoustic wave takes place, and a frame-like boundary area surrounding it and turned outwards. The boundary area is characterized in that there, a longitudinal mode TE1, similar to a longitudinal mode, capable of propagation in the active area, but at a resonance frequency which is lower for a monotonically increasing dispersion in the active area and higher for a monotonically decreasing dispersion in the boundary area. In this respect, the boundary area has the same layer structure as the active area, wherein to reduce the resonance frequency above the piezoelectric layer, an additional layer is placed, which can be located above or below the upper electrode. This additional layer is a frame which surrounds the active area. The dispersion should be either decreasing or increasing both in the boundary area and also in the active area.

In this way, it is possible to effect $k_{x,y} \approx 0$ in the active area and thus, a uniform excitation of the main mode with a rectangular excitation profile. In this case, with a monotonic dispersion, all modes with $k_{x,y} > 0$ are suppressed in the active area. It is advantageous if in the active area—that is, the area with a significant excitement of the acoustic wave—the dispersion is monotonically increasing, at least up to the value $k_{x,y} = 50\pi/L$. This can be brought about with the second partial mirror in the indicated resonator stack.

The reflection coefficient for the secondary mode is larger in the second partial mirror than in the first partial mirror. In the second partial mirror, the reflection coefficient for the secondary mode is larger than for the main mode. Since only the lower mirror layers of the complete mirror, consisting of a first and second partial mirror, are designed for the preferred reflection of the secondary mode, whereas the upper mirror layers, turned to the resonator area, are provided for the preferred reflection of the main mode, it is possible to effect the desired dispersion behavior in the resonator without electroacoustic coupling losses. Since the lower mirror layers also reflect the main mode well, the resonance quality factor is retained, in comparison with the known embodiment in which all layers of the complete mirror are designed for reflection of the main mode. Thus, the indicated resonator is suitable for the development of high-frequency filters with low insertion loss, high edge steepness, and a wide bandwidth.

Several secondary modes can be propagated in the resonator. The secondary mode to be locked in is, in particular, a wave mode unlike the main mode and capable of propagating in the resonance space, 1) whose resonance frequency is closest to the main mode, in comparison with other waves of the resonance frequency, capable of propagation in the resonator stack and/or 2) that has the strongest coupling to the main mode, in comparison with other waves that are capable of propagating in the resonator stack. The secondary mode to be locked in can, for example, be a harmonic of a shear wave, excitable in the resonator area, whose wavelength approximately corresponds to twice the wavelength of the fundamental mode of this shear wave. Other secondary modes primarily have higher frequencies than the first shear wave, and under certain circumstances, can also influence the dispersion curve of the longitudinal fundamental mode.

In the following description, it is assumed that the main mode is a longitudinal mode and the secondary mode is a shear mode. Accordingly, the first partial mirror is designated as a longitudinal mirror and the second partial mirror as a shear mirror. However, this description is generally valid, for arbitrary main and secondary modes, and can be transferred to other types of waves without restriction.

At the resonance frequency of the resonator, the first partial mirror preferably reflects at least 90% of the energy of the incident longitudinal wave into the resonator area. The second partial mirror preferably reflects at least 90% (−20 dB) of the energy of the incident shear wave.

A longitudinal mode, whose half wavelength is essentially equal to the thickness of the resonator area at the resonance frequency of the resonator, is designated as the TE1 mode. Arbitrary shear modes, whose wavelength is essentially equal to the thickness of the resonator area at the resonance frequency of the resonator and whose resonance frequency is in the vicinity of the resonance frequency of the main mode, are designated as the TS2 mode. What is meant, in particular, is the first upper harmonic wave or second harmonic of the fundamental mode of a shear wave.

In principle, what was said in connection with the TS2 mode is also valid for an arbitrary secondary mode to be locked in at another frequency position. With several secondary modes to be locked in, an individual second partial mirror can be provided per mode.

The cut-off frequency of a main mode (longitudinal mode) or secondary mode (shear mode) are understood to mean the resonance frequency $f_L$ or $f_S$ of this mode at $k_{x,y}=0$. The resonance frequency $f_R$ of the resonator is equal to the cut-off frequency $f_{c,L}=F_L (k_{x,y}=0)$ of the main mode, which is above the cut-off frequency $f_{c,S}=f_S (k_{x,y}=0)$ of the secondary mode, with normal dispersion.

The acoustic mirror comprises a number N of alternatingly placed mirror layers with high and low acoustic impedance. These layers comprise at least one first mirror layer placed in the first, that is, the upper, partial mirror and at least one first mirror layer placed in the second, that is, the lower, partial mirror. The first partial mirror comprises a number $N_L$ of first mirror layers ($N_L \geq 1$)—and in an advantageous variant, a sequence of several first mirror layers with a higher and lower acoustic impedance ($N_L \geq 2$). The second partial mirror comprises a number $N_S$ of second mirror layers with high and low acoustic impedance. In one variant, $N_S=N-N_L$. In a second variant, $N_S=N-N_L-N_{ZS}$, if a number $N_{ZS} \geq 1$ additional mirror layers are provided as intermediate layers between the two partial mirrors.

It is advantageous if the individual partial mirror has at least one pair of layers—that is, an arrangement of two successive layers with low and high acoustic impedance.

For example, $SiO_2$, BCB, or an organic material is suitable as a material for a first or a second mirror layer with low acoustic impedance; W or Mo, for example, is suitable as a material for a first or second mirror layer with high acoustic impedance. A high-impedance layer can comprise, for example, partial layers made up of W and Mo, one after the other. In the sequence of the layers with a high and low impedance, for example, various layers with high impedance can be found—layers made up of different materials, for example, a W layer in one pair of layers and a Mo layer in the other pair of layers of this sequence. Something similar is also valid for the layers with the low impedance.

In an advantageous variant, the complete mirror consists of four mirror layers, where the first partial mirror has two first mirror layers, and the second partial mirror has two second mirror layers. The first and/or second partial mirror can also have two pairs of layers, where the complete mirror consists of six mirror layers. Depending on the variant, an odd number of corresponding mirror layers can be provided in the first and/or second partial mirror.

In another preferred variant, the complete mirror consists of eight mirror layers, where the first partial mirror consists of four first mirror layers and the second partial mirror consists of four second mirror layers. The first and second mirrors are a sequence of the first and second mirror layers with a low and high acoustic impedance.

The cut-off frequency $f_{c,S}$ of the secondary mode can be lowered by increasing the number $N_L$. Conversely, the frequency $f_{c,S}$ can be raised by decreasing the number $N_L$. This frequency can also be adjusted by the adaptation of the size of the resonance space provided for the shear wave—above all, by the adaptation of the layer thicknesses of the mirror layers lying above the second partial mirror. The thicker these mirror layers, the larger will be the resonance space for the shear wave and the lower the resonance frequency of the shear wave. In particular, the lowermost layer or the lower layers of the first partial mirror or at least one intermediate layer is suitable for lowering the frequency $f_{c,S}$ without thereby influencing the resonance frequency $f_R$.

The thickness $d_L$ of the first mirror layers is essentially $\lambda_L/4$ or $v_L/4f_R$, where $v_L$ is the propagation velocity of the longitudinal wave TE1 in the individual layer. The thickness ds of the second mirror layers is essentially $\lambda_S/4$ or $\lambda_S/4f_R$, where $v_S$ is the propagation velocity of the shear wave TS2 in the individual layer. The thickness $d_{ZS}$ of the intermediate layer is preferably between $\lambda_S/4$ and $\lambda_L/4$. The layer thicknesses $d_L$, $d_S$, and $d_{ZS}$ can differ, perhaps up to 20%, from the values indicated here. The thickness of the intermediate layer can also be less than min $\lambda_S/4, \lambda_L/4$ or greater than max $\lambda_S/4, \lambda_L/4$.

A relatively high electroacoustic coupling can be achieved in the resonator stack with two partial mirrors in that the thickness of the uppermost mirror layer of the first partial mirror, which faces the resonator area, or the thickness of two uppermost first mirror layers, differs from $\lambda_L/4$ and, in particular, is set smaller than this value. This layer thickness, however, can also be selected larger than $\lambda_L/4$.

The number of the second mirror layers, the layer thicknesses, and the material of these layers are preferably selected in such a way that, at its resonance frequency, the secondary mode has $[N_L/2]+3$ wave antinodes and $[(N_L+1)/2]+2$ wave nodes in the resonance space. This is equivalent to the statement that, at its resonance frequency, the secondary mode has $4+N_L$ quarter-waves in the resonance space. The brackets signify the whole-number part of a fraction, for example, $[3/2]=1, [5/2]=2$.

The second partial mirror can also be made so that on the interface of a second mirror layer, which has a high acoustic impedance and which preferably forms the uppermost layer of the second partial mirror, and a subsequent, additional mirror layer facing the resonator area with a low acoustic impedance, there is a wave node of the secondary mode. The additional mirror layer is, for example, the first mirror layer— that is, the lowermost layer of the first partial mirror, or the aforementioned intermediate layer. The second partial mirror is preferably formed in such a way that there is a wave antinode at the interface of its preferably uppermost mirror layer, which has a low acoustic impedance, and another, overlying mirror layer, which has a high acoustic impedance.

The resonator stack is preferably placed on a carrier substrate. With a semiconducting carrier substrate made of Si, for example, the resonator stack can comprise an insulating layer made of $SiO_2$, for example, which is located between the second partial mirror and the substrate.

In the following, the indicated component will be explained in more detail with the aid of schematic figures which are not true to scale. The same or similarly functioning parts are designated by the same reference symbols. The figures show the following:

DESCRIPTION OF THE DRAWINGS

FIG. 2, calculated real and imaginary parts of the lateral excursions of the material in the first resonator mirror as a function of the longitudinal direction for the secondary mode TS2 at $k_x \approx 0$ and at the cut-off frequency of the secondary mode;

FIG. 3, calculated real and imaginary parts of the lateral excursions of the material in the second resonator stack as a function of the longitudinal direction for the secondary mode TS2 at $k_x \approx 0$ and at the cut-off frequency of the secondary mode;

FIG. 4, calculated real and imaginary parts of the lateral excursions of the material in the third resonator stack as a function of the longitudinal direction for the secondary mode TS2 at $k_x \approx 0$ and at the cut-off frequency of the secondary mode;

FIG. 5A, real and imaginary parts of the lateral excursions of the material in the insulated resonator area of the second resonator stack as a function of the longitudinal direction for the secondary mode TS2' at $k_x \approx 0$ and at the cut-off frequency of the secondary mode TS2' of the insulated resonator area;

FIG. 5B, real and imaginary parts of the lateral excursions of the material in the insulated acoustic mirror area of the second resonator stack as a function of the longitudinal direction for the UX3/4 secondary mode at $k_x \approx 0$ and at the cut-off frequency of this secondary mode;

FIG. 5E, dispersion curves, calculated for the second resonator mirror in accordance with FIG. 3, for modes that can propagate in the insulated mirror area, the insulated resonator area, and the total resonator stack;

FIG. 9, a resonator, operating with bulk waves, with a stack which comprises an acoustic mirror with a total of eight mirror layers;

DETAILED DESCRIPTION

Figure 1:
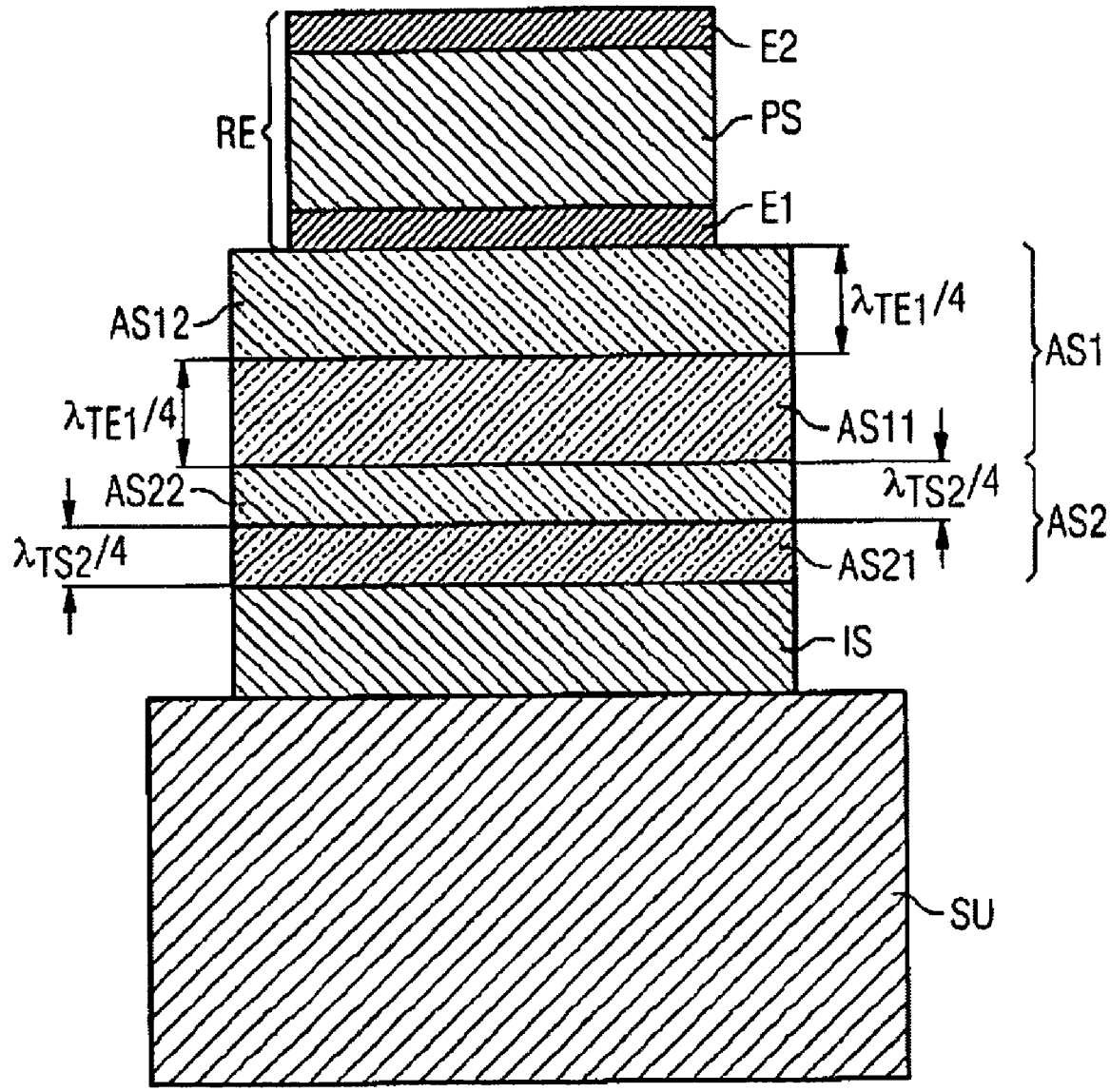
FIG. 1, a resonator, operating with bulk acoustic waves, with a stack which has an acoustic mirror with a total of four mirror layers.

FIG. 1 shows a component with a thin layer resonator that operates with bulk acoustic waves. A resonator stack is built up on a carrier substrate SU, which comprises a resonator area RE and an acoustic mirror with a first partial mirror AS1 and a second partial mirror AS2. The resonator area RE comprises two electrodes E1 and E2 and a piezoelectric layer PS located therebetween. In this example, the complete mirror comprises a total of four mirror layers AS11, AS12, AS21, and AS22.

In the resonator stack, a longitudinal wave TE1 is excited as a main mode and a shear wave TS2 is excited as a secondary mode that is strongly coupled to the main mode and is therefore to be localized.

The first partial mirror AS1 is designed mainly for high reflection of the longitudinal main TE1 mode and is therefore called a longitudinal mirror. It comprises the first mirror layers AS11, made of W, for example, and AS12, made of SiO$_2$, for example, whose thickness is essentially $\lambda_{TE1}/4$, where $\lambda_{TE1}$ is the wavelength of the TE1 mode in the individual material. The first partial mirror AS1 is located between the resonator area RE and the second partial mirror AS2.

The second partial mirror AS2 is mainly designed for high reflection of the secondary mode—in this example, the shear mode TS2, and is therefore called a shear mirror. A shear mirror has a higher reflection coefficient for the shear wave TS2 than for the longitudinal wave TE1. Conversely, a longitudinal mirror AS1 has a higher reflection coefficient for the longitudinal wave TE1 than for the shear wave TS2.

In very general terms, the shear mirror AS2 is characterized in that it is more reflective of the shear wave than the longitudinal wave, whereas the longitudinal mirror AS1 is characterized in that it is more reflective of the longitudinal wave than the shear wave.

A subsystem of the resonator stack can be characterized by a transmission coefficient. The subsystem can be, for example, a first or second mirror layer, the partial mirror AS1, AS2, the complete mirror AS1+AS2 or an area of the resonator stack that lies below the resonator area. The transmission coefficient of a subsystem indicates which portion of a wave, which is incident on the subsystem from above, emerges at the lower boundary layer of this subsystem. It is always assumed that the individual layers, which lie above and below the subsystem, extend infinitely. The relationship between the transmission coefficient T and the reflection coefficient R is R=1−T.

The locking in of the shear wave in a resonance space, which essentially consists of the resonator area RE and the longitudinal mirror AS1, takes place, in particular, if the shear wave reflectivity of the shear mirror AS2 is clearly higher—for example, by at least 10 dB—than the mirror AS1. The transmission coefficient for the shear wave of the shear mirror AS2 can thereby be smaller by at least 15 dB, preferably by at least 20 dB, than that of the longitudinal mirror AS1.

In the variant presented in FIG. 1, the second partial mirror AS2 comprises two second mirror layers AS21, made of W, for example, and AS22, made of SiO$_2$, for example, whose thickness is essentially $\lambda_{TS2}/4$, where $\lambda_{TS2}$ is the wavelength of the mode TS2. The second partial mirror AS2 is located between the first partial mirror AS1 and the carrier substrate SU. Furthermore, an electrically insulating insulation layer IS, made of SiO$_2$, for example, is located between the second partial mirror AS2 and the substrate SU.

The ratio of the propagation velocities of the longitudinal wave TE1 and the shear wave TS2 is dependent on the material in which these waves propagate. The velocity of the shear wave, however, is primarily approximately half that of the longitudinal wave. Therefore, the shear mirror AS2 can also reflect a part of the longitudinal wave TE1 (already damped by the first partial mirror).

An acoustic mirror AS1+AS2 with a total of four mirror layers is preferred. Preferably, its two uppermost layers AS11, AS12 belong to the longitudinal mirror AS1, and at least its lowermost layer AS21 belong to the shear mirror AS2. The second lowermost layer—in FIG. 1, the layer AS22—can belong to the first or the second partial mirror or, as in the example in accordance with FIG. 4, can be provided as an intermediate layer ZS, wherein, depending on the thickness of this layer, the dispersion curve and particularly the cut-off frequency for the secondary mode can be shifted.

AlN, for example, is suitable for the piezoelectric layer PS. This material is characterized by a Poisson number $\mu > \frac{1}{3}$. In such a material, the dispersion decreases monotonically—that is, abnormally. However, by means of the arrangement of the shear mirror below the longitudinal mirror, a reversal to a normal dispersion behavior is effected for the total resonator stack. A normal—that is, monotonically increasing—dispersion is attained if at $k_x=0$, the resonance frequency of the shear mode TS2 is below that of the longitudinal mode TE1.

By means of a selection of the thicknesses of the mirror layers of the shear mirror as a function of its material—explained below in connection with FIGS. 2, 3, and 4,—the shear wave TS2 is locked in above this partial mirror, that is, in the resonance space formed by the resonator area and the longitudinal mirror, in such a way that a standing wave is formed.

Since the shear wave is blocked by the partial mirror AS2 and therefore can no longer escape into the carrier substrate SU, a coupled mode system, consisting of the modes TE1 and TS2, is present. As a result of the common symmetry of the wave functions, with respect to the middle of the piezoelectric layer PS, with increasing $k_x$, the two modes interact with and repel each other. The result of this is that in the case $f_{c,TE1} > f_{c,TS2}$, a normal dispersion is present, and in the case of $f_{c,TE1} < f_{c,TS2}$, an abnormal dispersion is present. Furthermore, the curvature of the dispersion curves of the modes TE1 and TS2 increases as the frequency interval between $f_{c,TE1}$ and $f_{c,TS2}$ decreases. Consequently, the slope of the dispersion curves can also be adjusted by shifting the frequency $f_{c,TS2}$.

The first partial mirror AS1 preferably has at least two first mirror layers. The second partial mirror AS2 can consist only of a second mirror layer in variants shown, for example, in FIGS. 3 and 4, wherein then, preferably, the first partial mirror has at least three first mirror layers, as in FIG. 3, or wherein an intermediate layer ZS is provided between the first and second partial mirror, as in FIG. 4, so that the total number of the mirror layers in the acoustic mirror AS1, AS2 is four or more.

The acoustic mirror preferably comprises alternatingly placed layers with high and low acoustic impedance. In one variant, as shown in FIGS. 1 and 2, the mirror layers AS11 and AS21 can have a high acoustic impedance, and the mirror layers AS12 and AS22 a low acoustic impedance. Conversely, the mirror layers AS11 and AS21 may have a low acoustic impedance, and the mirror layers AS12 and AS22 a high acoustic impedance.

Since the shear mirror AS2 is below the longitudinal mirror AS1, the mode TS2 penetrates more deeply into the complete mirror AS1, AS2 than the mode TE1, so that the resonance space available for the mode TS2 is greater than that for the mode TE1. The resonance space for the mode TS2 can be changed, independently of the resonance space for TE1, which is essentially limited to the resonator area. Therefore, the resonance frequency $f_{c,TS2}=f_{TS2}$ ($k_x=0$) of the mode TS2 can be adjusted largely independently of $f_{c,TE1}$. Specifically, the frequency $f_{c,TS2}$ can be set below the frequency $f_{c,TE1}$.

In one variant, a mirror with a number N>4 mirror layers can be provided for a further reduction of the cut-off frequency $f_{c,TS2}$, where the lower Ns mirror layers form the shear mirror and the overlying $N_L$ mirror layers the longitudinal mirror. With sufficient reflectivity of individual mirror layers, acoustic mirrors with less than a total of four mirror layers are also conceivable.

The position of the cut-off frequency $f_{c,TS2}$ can be deliberately influenced by the natural characteristics of the lower partial mirror AS2. In order to reduce the frequency $f_{c,TS2}$, the shear mode must be permitted to penetrate even more deeply into the mirror. For this purpose, for example, the thickness of the upper mirror layer AS22 of the shear mirror AS2 can be increased in comparison with at least one second underlying mirror layer AS21, and thus the reflectivity of this shear mirror to shear waves can be reduced in comparison with a shear mirror with two equally thick second mirror layers AS21, AS22. An intermediate layer ZS, in accordance with the variant shown in FIG. 4, is thereby formed from the upper second mirror layer AS22. On the other hand, the cut-off frequency $f_{c,TS2}$ can be raised by reducing the thickness of the lowermost mirror layer AS11 of the longitudinal mirror AS1 in comparison with the at least one first overlying mirror layer AS12, so that it more highly reflects the shear mode than the original longitudinal mirror with two equally thick first mirror layers AS11, AS12.

The size of the resonance space provided for the mode TS2, and thus the position of the cut-off frequency $f_{c,TS2}$, can also be influenced by changing the layer thicknesses of the upper partial mirror AS1. These layer thicknesses can differ, for example, up to 20%, from $\lambda_{TE1}/4$.

The resonators with the first (FIG. 2), second (FIG. 3), and third (FIG. 4) resonator stack differ among one another primarily in that the thickness of the second lowermost mirror layer, corresponding to the layer AS22 in FIG. 1, varies (see the data of Tables 1 to 3). The second lowermost mirror layer is layer AS22 in FIG. 2, which is associated with the second partial mirror because of its thickness; the layer AS11 in FIG. 3, which is associated with the first partial mirror; and the intermediate layer ZS in FIG. 4. The thickness of the insulation layer IS is ca. $\lambda_{TE1}/4$ in the first resonator stack. The thickness of the insulation layer IS in the second and third resonator stacks is less than $\lambda_{TE1}/4$ and is selected to be the same in these two variants.

In FIG. 3, the mirror layers AS12 and AS2 have a high acoustic impedance, and the mirror layers AS11 and AS13 have a low acoustic impedance. In FIG. 4, the mirror layers AS11 and AS2 have a high acoustic impedance, and the mirror layers ZS and AS12 have a low acoustic impedance.

$SiO_2$ is particularly suitable as a material for mirror layers with a low acoustic impedance. Other materials usually used in this regard can also be taken into consideration.

In principle, each mirror layer can have several partial layers, all of which have, for example, either a relatively low or a relatively high acoustic impedance. For example, the layer with a high acoustic impedance can comprise a layer sequence consisting of a preferably thin lower Ti layer and a preferably, clearly thicker, upper W layer.

The piezoelectric layer PS and the electrodes E1, E2 can also be formed as a layer sequence consisting of several different partial layers.

A ceramic or silicon is suitable as the material for the carrier substrate SU. With an at least partially electrically conductive carrier, the insulating layer IS, which is located between this carrier and the resonator stack, is particularly advantageous.

In principle, other intermediate layers also can be provided to the intermediate layer ZS shown in FIG. 4, whose thickness is between the thickness of the first and the second mirror layer. Preferably, all intermediate layers are located between the first and second partial mirror. However, it is also possible to place an intermediate layer between two first mirror layers, between two second mirror layers, above the first partial mirror or below the second partial mirror. In principle, the thickness of at least one of the intermediate layers can be greater than the thickness of the thicker of the first and the second mirror layers or smaller than the thickness of the thinner of the first and the second mirror layers.

Table 1 gives layer thicknesses (nm) of the mirror layers used in different resonator stacks. The mirror layers of both the first and the second partial mirrors are designated AS. Tables 2, 3, and 4 give layer thicknesses of the mirror layers used in the first, second, or third resonator stacks, normalized $\lambda_{TE1}$ in the individual mirror layer. The dispersion curves for this resonator stack are explained in connection with FIG. 8A.

In the known stack, all four mirror layers are provided as first mirror layers. In the first, second, and third stacks, the lowermost mirror layer is formed with the thickness of a second mirror layer. The second lowermost mirror layer is also formed as a second mirror layer in the first stack. The second lowermost mirror layer is provided as a first mirror layer in the second stack and as an intermediate layer in the third stack. In the second and third stacks, moreover, a thickness of the insulating layer IS is established, which is relatively small in comparison with the known stack.

TABLE 1

| Layer | Material | Known stack | First stack | Second stack | Third stack |
| --- | --- | --- | --- | --- | --- |
| SU | Si | 150000 | 150000 | 150000 | 150000 |
| IS | SiO$_2$ | 765 | 765 | 483 | 483 |
| AS (AS2) | Ti/W | 22/675 | 22/380 | 22/372 | 22/372 |
| AS (AS2, AS1, ZS) | SiO$_2$ | 765 | 500 | 765 | 650 |
| AS (AS1) | Ti/W | 22/675 | 22/675 | 22/675 | 22/675 |
|  | SiO$_2$ | 570 | 570 | 570 | 570 |
| E1 | Ti/AlCu | 50/150/ | 50/150/ | 50/150/ | 50/150 |
|  | Ti/W | 50/180 | 50/180 | 50/180 | 50/180 |
| PS | AlN | 1710 | 1710 | 1710 | 1710 |
| E2 | AlCu/Ti | 170/50 | 170/50 | 170/50 | 170/50 |

At f = 1880 MHz, $\lambda_{TS2}/4$ is 380 nm in W and 500 nm in SiO$_2$.
At f = 1880 MHz, $\lambda_{TE1}/4$ is 695 nm in W and 794 nm in SiO$_2$.

TABLE 2

| Layer | Material | Ratio of the layer Thickness to $\lambda_{TS2}$ |
| --- | --- | --- |
| IS | SiO$_2$ | 0.241 |
| AS21 | W | 0.137 |
| AS22 | SiO$_2$ | 0.157 |
| AS11 | W | 0.243 |
| AS12 | SiO$_2$ | 0.179 |

FIG. 2 shows the real parts (curve 1) and imaginary parts (curve 2) of the lateral excursions $u_x$ of the material in the first resonator stack as a function of the longitudinal direction for the shear mode TS2, at $k_x \approx 0$ and at the cut-off frequency $f_{TS2}$ of the TS2 mode, which, in this case, is 1847 MHz.

The layer thicknesses are selected in such a way that with the given material of these layers, either a wave antinode or a wave node of the standing wave of the TS2 shear mode appears at the interface of the two partial mirrors AS1, AS2. The condition Re $\{U_x\}$=Im $\{U_x\}$=0 is fulfilled at the wave node.

A wave antinode appears if the wave from a layer with a higher acoustic impedance strikes a layer with a lower acoustic impedance. This case appears at the interface of the layers AS11, AS22 in FIG. 2. The upper layer AS11 thereby has a higher impedance than the lower layer AS22.

A wave node appears if the wave from a layer with a lower acoustic impedance strikes a layer with a higher acoustic impedance. This case appears at the interface of the layers AS11 and AS2 in FIG. 3. The upper layer AS11 thereby has a lower impedance than the lower layer AS2.

In FIGS. 2 to 5D, wave nodes are located at the sites on which curves 1 and 2 intersect—that is, where the condition Re $\{U_x\}$=Im $\{U_x\}$=0 is fulfilled. Wave antinodes are located at the sites of the maximum excursion between two successive wave nodes.

With the given material of the layers, the layer thicknesses of the second mirror layers are preferably selected in such a way that a wave node of the TS2 mode appears at the interface of a second mirror layer and an overlying layer if the wave from an (upper) layer with a lower impedance is incident on a (lower) layer with a higher impedance.*

*[This paragraph is repeated in the original text.]

The upper layer with the lower impedance is, for example, the layer AS22, and the lower layer with the higher impedance is the layer AS21 in the variant in accordance with FIG. 2, so that in this case a wave node appears at the interface between two second mirror layers AS21, AS22.

The layer lying above the second mirror layer AS2 is the intermediate layer ZS in FIG. 4, so that in this case, a wave node appears at the interface of the layers AS2 and ZS or at the interface of the second partial mirror and the intermediate layer ZS.

Generally, there are no wave nodes or wave antinodes of the TS2 mode at the interface of the first mirror layers AS11, AS12 and at the interface of the upper first mirror layer AS12 with the resonator area RB. This can be seen in FIGS. 2, 3, 4.

In a preferred variant, the total thickness of the resonator area can be selected in such a way that the shear mode TS2 there forms two half-waves. This means that there is a wave antinode at the upper interface of the resonator area, and that within the resonator area there is another wave antinode and two wave nodes, whereas a third wave antinode essentially appears at the interface between the resonator area, and the first mirror AS1.

In the examples in accordance with FIGS. 2, 3, and 4, one can see that only two wave antinodes of the secondary mode appear in the resonator area RE, wherein its third wave antinode was shifted into the first partial mirror. Essentially three quarter-waves are formed in the resonator area RE. This effect leads to the cut-off frequency $f_{c,TS2}$ of the TS2 being lower, compared with the cut-off frequency $f_{c,TS2}$ of an insulated resonator stack.

TABLE 3

| Layer | Material | Ratio of the layer Thickness to $\lambda_{TE1}$ |
| --- | --- | --- |
| IS | SiO$_2$ | 0.152 |
| AS2 | W | 0.137 |
| AS11 | SiO$_2$ | 0.241 |
| AS12 | W | 0.243 |
| AS13 | SiO$_2$ | 0.179 |

FIG. 3 shows the real parts (curve 1) and imaginary parts (curve 2) of the lateral excursions of the material in the second resonator stack as a function of the longitudinal direction for the shear mode TS2, at $k_x \approx 0$ and at the cut-off frequency $f_{TS2}$ of the TS2 mode, which in this case is 1792 MHz.

TABLE 4

| Layer | Material | Ratio of the layer Thickness to $\lambda_{TE1}$ |
|---|---|---|
| IS | $SiO_2$ | 0.152 |
| AS2 | W | 0.137 |
| ZS | $SiO_2$ | 0.205 |
| AS11 | W | 0.243 |
| AS12 | $SiO_2$ | 0.179 |

FIG. 4 shows the real parts (curve 1) and imaginary parts (curve 2) of the lateral excursions of the material in the third resonator stack as a function of the longitudinal direction for the shear mode TS2, at $k_x \approx 0$ and at the cut-off frequency $f_{TS2}$ of the TS2 mode, which in this case is 1823 MHz.

From FIGS. 2, 3, and 4, one can see that the fraction of the shear wave found in the acoustic mirror is increased with the enlargement of the resonance space for the shear wave in the acoustic mirror and is greatest in the second resonator stack (FIG. 3).

The interaction of the wave modes TE1 and TS2 should be explained with the aid of Lamb modes in a plate of the thickness B=2b. For isotropic materials, the dispersion relations result as a solution of the equation:

$$\frac{\tan\beta b}{\tan\alpha b} = -\frac{4(k_x b)^2 (\beta b)(\alpha b)}{[(k_x b)^2 - (\beta b)^2]^2} \text{ with}$$

$$b\alpha = \sqrt{\left(\frac{\omega b}{v_L}\right)^2 - (k_x b)^2} \text{ and}$$

$$b\beta = \sqrt{\left(\frac{\omega b}{v_s}\right)^2 - (k_x b)^2},$$

where $k_x$ is the wave number of the lateral wave; $v_s$ and $V_L$, the velocities of the shear wave or the longitudinal wave.

The resonance frequency of the TE1 mode at $k_x=0$ is $f_{TE1}=v_L/4b$. The resonance frequency of the TS2 mode, at $k_x=0$, is $f_{TS2}=v_s/2b$.

If one then considers the case of smaller values of $k_x$ and assumes that for the frequencies $f_{TE1}$, $f_{TS2}$ and another frequency f, the difference $|f_{TE1}-f_{TS2}|$ and $|f-f_{TS2}|$ is very much smaller than $f_{TE1}$, then the resulting equation is as follows:

$$(k_x)^2 = C(f - f_{TE1})(f - f_{TS2}), \text{ where}$$

$$C = \frac{1}{16B^2 f_{TE1} f_{TS2}} \text{ and}$$

$$f = f = \frac{f_{TE1} + f_{TS2}}{2} \pm \sqrt{\left(\frac{f_{TE1} - f_{TS2}}{2}\right)^2 + \frac{k_x^2}{C}}$$

are valid.

With this equation, it is possible to show that $$\frac{\partial f}{\partial k_x}(k_x = 0) = 0 \text{ and } \frac{\partial^2 f}{\partial^2 k_x}(k_x = 0) = \frac{2}{C(f_{TE1} - f_{TS2})}$$

This means that the dispersion curve at $k_x=0$ is a horizontal tangent, and that the curvature of the dispersion curve is inversely proportional to the difference between the resonance frequencies $f_{TE1}(k_x=0)$ and $f_{TE2}(k_x=0)$, that is, between the cut-off frequencies of the TE1 and TS2 modes.

The nature of the TS2 mode and the behavior of its resonance frequency $f_{TS2}$ with a variation of the low position of the shear mirror will be explained below. The second resonator stack, which has three longitudinal mirror layers AS11, AS12, AS13 above the shear mirror AS2, is used as an example.

The shear mode TS2, capable of propagation in the total stack, is associated with a shear mode TS2', which is capable of propagation in a resonator area RE, insulated by the mirror. The shear mode TS2 is also related to another shear mode, which can propagate in a mirror area, insulated by the resonator area, The mirror area comprises the two partial mirrors AS1, AS2 and the substrate SU and perhaps the insulation layer IS—that is, all components of the resonator stack, except for the resonator area RE.

FIG. 5A shows the shear mode TS2' in the insulated resonator area RE, which in this figure is adjacent to air on the left and right. The real and imaginary parts of the excursions $u_x$ of the shear mode TS2', calculated for the cut-off frequency $f_{TS2,c}=f_{TS2}(k_{x,y}=0)=2143$ MHz of the secondary mode TS2' in the insulated resonator area RE, are shown as a function of the longitudinal direction z. Two half-waves of the secondary mode fit between the upper and lower—in FIG. 5A between the left and right—boundaries of the resonator area RE.

As FIG. 5B shows, a shear mode designated as the UX3/4 mode can propagate in the insulated acoustic mirror area. The designation UX3/4 means that essentially three quarter-waves of this secondary mode—that is, approximately one quarter-wave in each longitudinal mirror layer—form in the longitudinal mirror AS1. FIG. 5B shows the real and imaginary parts of the lateral excursions of the material in the acoustic mirror AS1, AS2 of the second resonator stack, calculated for the secondary mode UX3/4, at the cut-off frequency of this mode—that is, at $k_x \approx 0$, as a function of the longitudinal direction z. The cut-off frequency of the secondary mode UX3/4 is 1464 MHz.

Figure 5C:
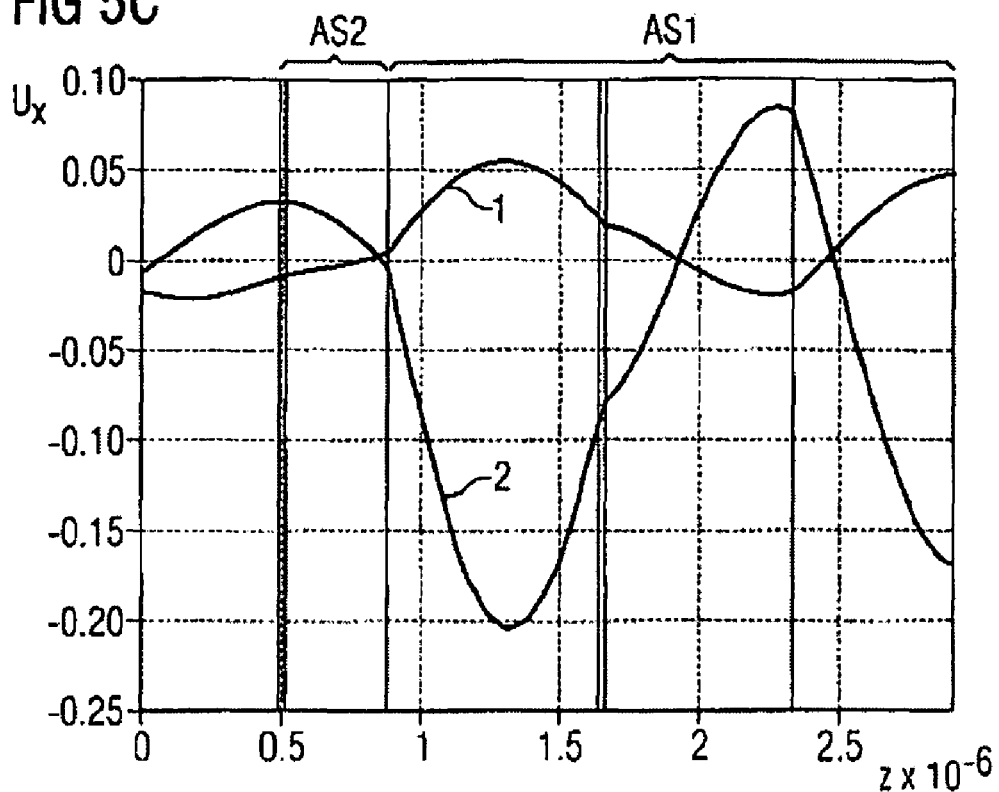
FIG. 5C, real and imaginary parts of the lateral excursions of the material in the insulated acoustic mirror area of the second resonator mirror as a function of the longitudinal direction for the UX5/4 secondary mode at $k_x \approx 0$ and at the cut-off frequency of this secondary mode.

The next higher shear mode that can propagate in a mirror area insulated by the resonator area is designated as the UX5/4 mode. This mode is characterized in that five quarter-waves of this secondary mode are formed in the longitudinal mirror. FIG. 5C shows the real and imaginary parts of the lateral excursions of the material in the acoustic mirror AS1, AS2 of the second resonator stack, calculated for the secondary mode UX5/4, at the cut-off frequency of this mode—that is, at $k_x \approx 0$, as a function of the longitudinal direction z. The cut-off frequency of the secondary mode UX5/4 is 2016 MHz.

The complete second resonator stack is shown in FIG. 3. A comparison of FIGS. 5A, 5B, and 3 shows that the shear mode TS2 of the complete system is composed of the TS2' mode, which can propagate in the resonator area, and the UX3/4 mode, which can propagate in the mirror area. Therefore, the TS2 mode can be viewed as a mixed TX2'/UX3/4 mode. The cut-off frequency of the secondary mode TS2 is 1792 MHz.

Figure 5D:
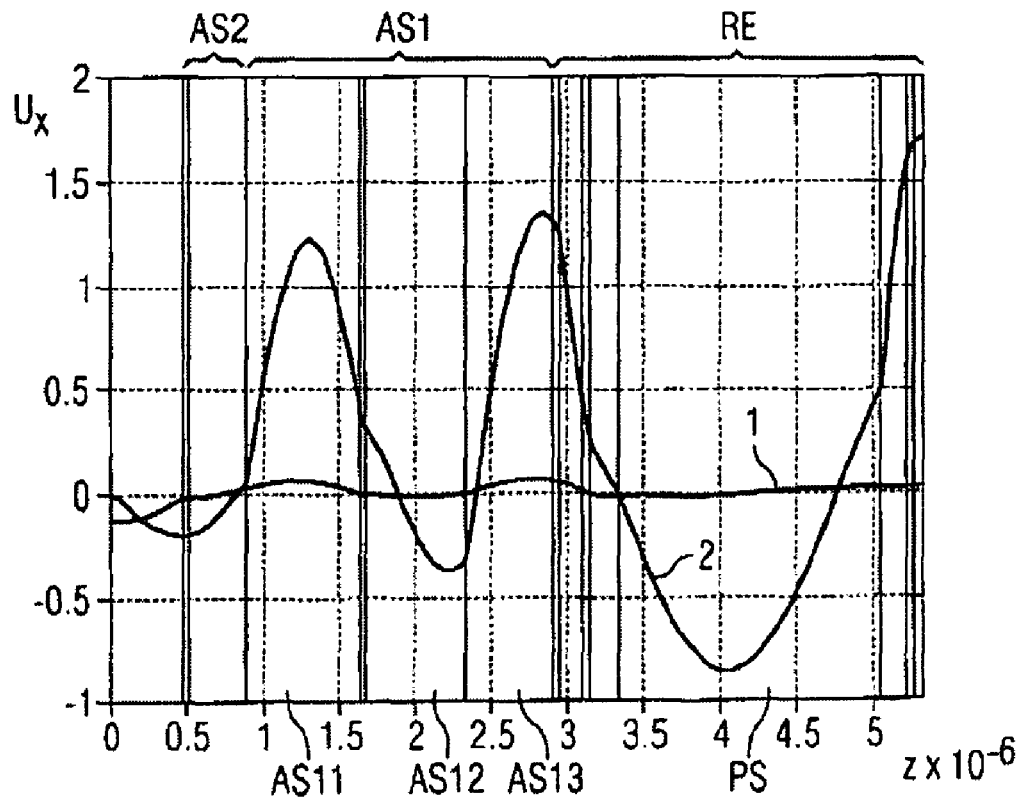
FIG. 5D, real and imaginary part of the lateral excursions of the material in the acoustic mirror and resonator area of the second resonator stack as a function of the longitudinal direction for the TX2'/UX5/4 secondary mode at $k_x \approx 0$ and at the cut-off frequency of this secondary mode.

A mixed TS2'/UX5/4 mode comes about in an analogous manner; it is composed of the TS2' and UX5/4 modes, which can propagate in the resonator and mirror area. FIG. 5D shows the real and imaginary parts of the lateral excursions of the material in the second resonator stack, calculated for this mixed secondary mode, at the cut-off frequency of this mode—that is, at $k_x \approx 0$, as a function of the longitudinal direction z. The cut-off frequency of the secondary mode TS2'/UX5/4 is 2098 MHz.

Figure 10A:
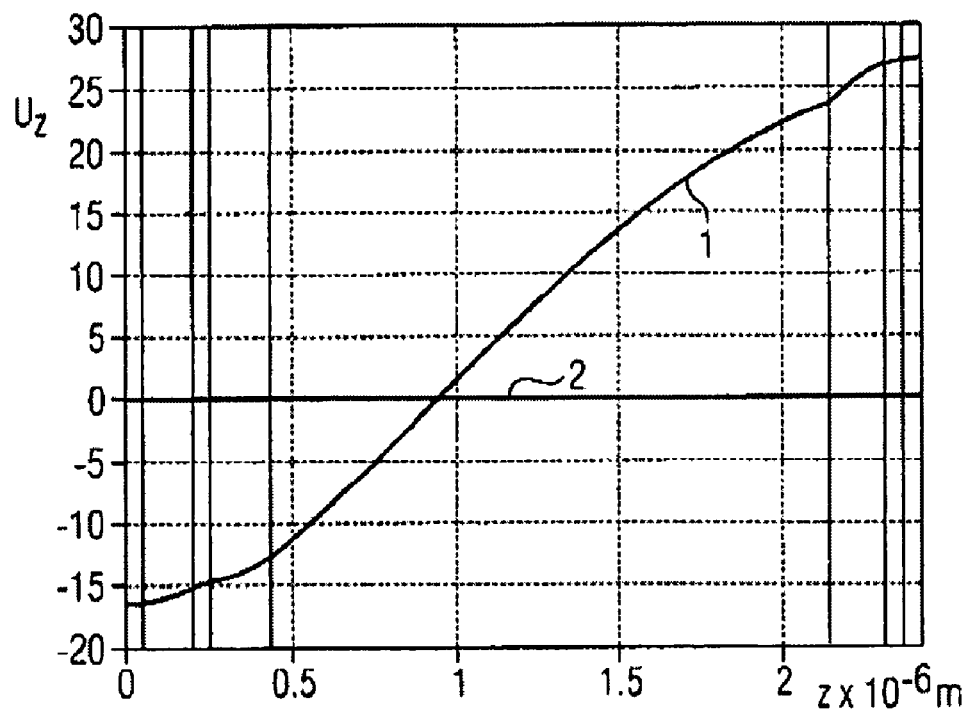
FIG. 10A, calculated real and imaginary parts of the longitudinal excursions of the material in the insulated resonator area of the second resonator stack as a function of the longitudinal direction for the main TE1 mode at $k_x \approx 0$ and at the cut-off frequency of the main TE1 mode of the insulated resonator area.

FIG. 10A refers to the longitudinal mode TE1' in the insulated resonator area RE, which in this figure is adjacent to air on the right and left. The real and imaginary parts of the excursions $u_z$ of the longitudinal mode TE1', calculated for the cut-off frequency $f_{TE1',c} = f_{TE1'} (k_{x,y}=0) = 1838$ MHz of the main TE1' mode in the insulated resonator area RE, are shown as a function of the longitudinal direction z. A half-wave of the main mode fits between the left and right interfaces of the resonator area RE.

Figure 10B:
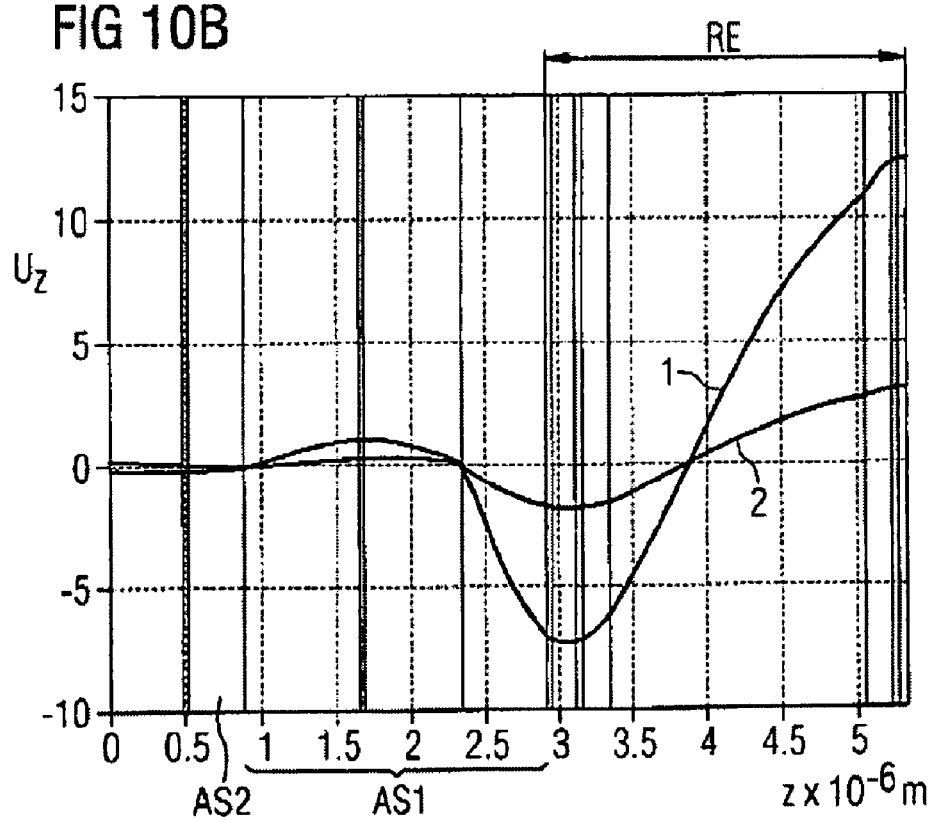
FIG. 10B, calculated real and imaginary parts of the longitudinal excursions of the material in the second resonator stack as a function of the longitudinal direction for the main TE1 mode at $k_x \approx 0$ and at the cut-off frequency of the main mode.

FIG. 10B refers to the longitudinal mode TE1 in the complete stack, at the cut-off frequency $f_{TE1',c} = f_{TE1'} (k_{x,y}=0) = 1882$ MHz of the main TE1' mode, wherein the stack comprises the resonator area according to FIG. 10A. Here, too, as in FIG. 10A, the longitudinal mode TE1 of the complete system is essentially restricted to the resonator area. Thus the resonance frequency of the main TE1 mode in the complete system $f_{TE1}$ differs only insignificantly from the resonance frequency of the main TE1' mode in the insulated resonator area.

The dispersion curves for the modes that can propagate in the two subsystems (resonator area, mirror area) and in the total system (resonator area+mirror area) are shown in FIG. 5E. The curve of the UX3/4 mode, capable of propagation in the mirror area, is clearly below the TS2' mode, capable of propagation in the resonator area. For this reason, the resonance frequency of the mixed TS2'/UX3/4 mode—that is, the TS2 mode—is between those of the "pure" TS2' and UX3/4 modes. By interacting the two subsystems, the resonance frequency of the shear mode was therefore lowered.

As can be seen from FIGS. 5B and 3, the wavelength of the mixed TS2'/UX3/4 mode in the mirror of the total system is smaller than in the insulated mirror, which is accompanied by a higher frequency. The third wave antinode, counted from the upper end of the resonator area, for the TS2 mode, excited in the complete system, is shifted left in comparison with the TS2' mode, excited in the insulated resonator area RE, which is related to an increase in the wavelength brought about by the addition of the mirror. The resonance frequency of the shear mode therefore drops in the resonator area of the complete system in comparison with the insulated resonator area.

The number of the quarter-waves of the total TS2'/UX3/4 mode in the resonance space is equal to the sum of the quarter-waves of the subsystems: in the complete system, the locked-in wave function has seven quarter-waves; in the insulated mirror area, there are three, and in the insulated resonator area four. This is also true for the total TS2'/UX5/4 mode: here, the number of nine quarter-waves in the complete system is retained.

The foregoing can be generalized to a system with N mirror layers, of which the number $N_L$ of upper layers are longitudinal mirror layers and the number $N_S = N - N_L$ of lower layers are shear mirror layers.

The shear modes $UX(N_L+2i)/4$ are formed in the mirror area, where i=0, 1, 2 . . . . With the TS2' mode, which can propagate in the resonator area RE, they form total modes TS2'/UX $(N_L+2i)/4$. The total mode in the resonance space provided for it has a number $N_L+2$ (i+2) of quarter-waves.

The resonance frequency of the total mode is between the resonance frequencies of the partial TS2' and UX $(N_L+2i)/4$ modes. If the resonance frequency of the shear mode TS2' which can propagate in the insulated resonator area is above that of the shear mode which can propagate in the insulated mirror area, then for the complete system, the wavelength of the shear mode in the mirror decreases and the one in the resonator area increases. Conversely, the wavelength of the shear mode TS2'/UX$(N_L+2i)/4$, which can propagate in the complete system, in the mirror increases and the one in the resonator area decreases, if the resonance frequency of the shear mode UX $(N_L+2i)/4$, which can propagate in the mirror area, is above the shear mode TS2', which can propagate in the resonator area. If the resonance frequency of the UX $(N_L+2i)/4$ modes is below that of the TS2' mode, a lowering of the resonance frequency of the total TS2'/UX $(N_L+2i)/4$ mode, in comparison with that of the TS2' mode, is thereby attained. Since, at the same time, the change of the resonance frequency of the main TE1 mode is only slight, a lowering of the frequency $f_{TS2}$ below the frequency $f_{TE1}$ and thus a monotonically increasing dispersion behavior can be attained. The resonance space can also be selected in such a way that $f_{TS2} > f_{TE1}$ and thus a monotonically decreasing dispersion behavior is established in the resonator mirror.

The reason that the resonance frequency $f_{TS2}$ of the TS2 mode decreases the lower the position of the shear mirror AS2 will now be explained. In this respect, a resonator stack, shown schematically in FIG. 9, with an acoustic mirror that has a total of eight mirror layers will be considered.

Furthermore, different variants of the mirror area are considered in which the number $N_L$ of upper mirror layers are formed, as before, as longitudinal layers, whereas the layers lying beneath are all formed as shear mirror layers. The shear mirror layers made of W have a thickness of 380 nm, and the shear mirror layers made of $SiO_2$ have a thickness of 500 nm.

The resonator stacks with six, four, and two longitudinal layers are designated as the fourth, fifth, and sixth stacks.

The sixth stack results from the known resonator stack presented in Table 1, in which, for example, two other shear mirrors, which are identical to the AS2 mirror, are inserted between the shear mirror AS2 and the insulation layer IS.

Figure 8A:
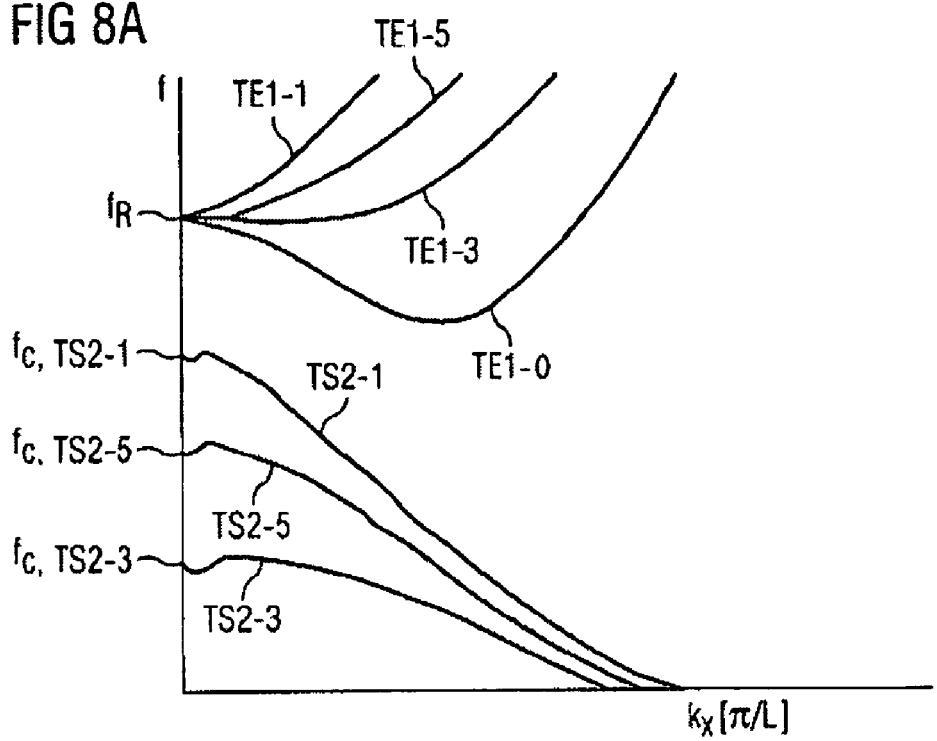
FIG. 8A, dispersion curves, calculated for various resonator stacks with a total of four mirror layers.
Figure 8B:
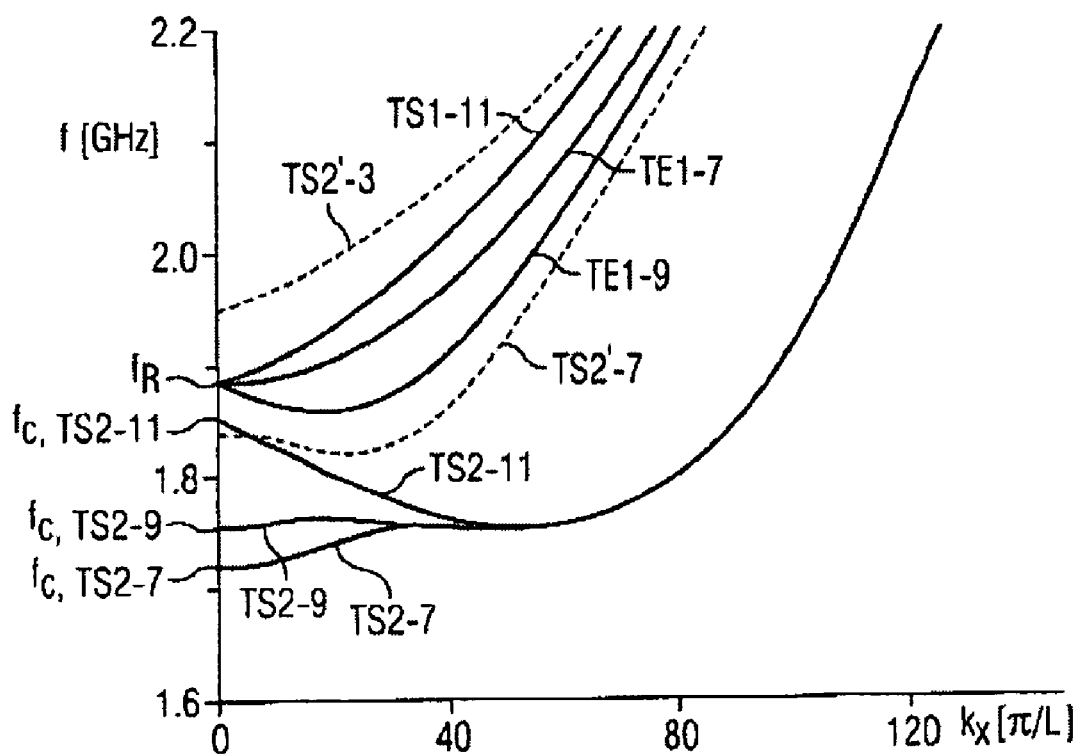
FIG. 8B, dispersion curves, calculated for various resonator stacks with a total of eight mirror layers.

The dispersion curves of the acoustic modes that can propagate in the fourth, fifth, or sixth stack, with a total of eight mirror layers, are shown in FIG. 8B.

The dispersion curves for the longitudinal mode TE1 are designated as TE1-7, TE1-9, and TE1-11 for the fourth, fifth, and sixth stacks. The dispersion curves of the shear modes of the TS2'/UX $N_L/4$ type are designated as TS2-7, TS2-9, and TS2-11 for the fourth, fifth, and sixth stacks. In FIG. 8B, furthermore, dispersion curves TS2'-7 and TS2'-9 are also shown for the higher shear modes of the TS2'/UX $N_L/4$ type, which can propagate in the fourth and fifth resonator stacks, whose cut-off frequency is in the vicinity of the resonance frequency $f_R$ of the resonator. The resonance frequency $f_R$ is the cut-off frequency of the longitudinal mode TE1—that is, the resonance frequency of this mode at $k_x=0$.

It can be seen clearly that the resonance frequency $f_{c,\,TS2-11}$, $f_{c,\,TS2-9}$ $f_{c,\,TS2-7}$ of the TS2 shear mode monotonically falls with an increasingly lower position of the shear mirror, which is the case when going from the sixth to the fifth stack and from the fifth to the fourth stack. This shear mode is of the TS2'/UX $N_L/4$ type.

A normal dispersion can be seen on the TE1-11 curve for the TE1 mode in the sixth stack since this curve is monotonic. The dispersion is abnormal when going over from the sixth to the fifth stack, which can be seen on the TE1-9 curve for the main mode in the fifth stack, which has a sagging area. Here, the resonance frequency $f_{c,\ TS2-9}$ of the shear mode TS2'/UX $N_L/4$, compared with the third stack, is already too far removed from that of the TE1 mode—that is, from the resonance frequency $f_R$ of the resonator. Now the TE1 mode interacts with a higher shear mode, whose cut-off frequency is approximately 1.95 MHz and whose dispersion curve is designated as TS2'-9 in FIG. 8B, since this mode, in accordance with the frequency, is closest to the main TE1 mode. This higher shear mode is also similar to the shear mode TS2' that can propagate in the insulated resonator area RE and forms a mode of the TS2'/UX $(N_L+2)/4$, type, whose resonance frequency is above that of the TE1 mode and leads to an abnormal dispersion in the resonator stack.

If the shear mode is allowed to penetrate even further into the mirror, which is the case with the transition from the fifth to the fourth stack, then the resonance frequency of this shear mode also falls, until finally in the variant with the first stack, a normal dispersion of the TE1 mode is once again established since here the resonance frequency of the higher shear mode TS2'/UX $(N_L+2)/4$ (see curve TS2'-7) has dropped below that of the TE1 mode (see curve TE1-7).

The falling of the resonance frequency of the shear mode TS2 with the lowering of the position of the shear mirror can be understood in such a way that the shear mode TS2 thereby increasingly penetrates the mirror. The fraction of the acoustic energy in the resonator thereby drops in favor of the fraction of the acoustic energy in the mirror. The maximum of the excursion in the piezoelectric layer PS is increasingly shifted, with increasing resonance space for the shear mode in the direction of the mirror. This is equivalent to the increase in the wavelength of the shear mode and the falling of its resonance frequency. The fraction of the phase of the shear wave in the mirror is thereby increasingly greater relative to the resonator area.

With the aid of these observations, it is possible to set up a simple model for the dependence of the resonance frequency $f_{TS2}$ of the shear mode TS2 on the layer thicknesses of the longitudinal mirror layers. The shear wave located above the shear mirror AS2 is thereby observed. As already mentioned in the foregoing, a shear mode of the TS2'/UX $N_L/4$ type has a number $N_L+4$ quarter-waves in a resonance space that is formed between the upper interface of the shear mirror and the upper interface of the resonator area. The phase of the shear wave in this resonance space is $(N_L+4)\pi/2$. In a first approximation, it is assumed that the reflections do not play a role at the layer interfaces. The result then is the phase difference for the TS2'/UX $N_L/4$ mode as:

$$\phi_{N_1} = \sum_{i=0}^{N_1} \frac{W_i}{v_i^S} 2\pi f,$$

where $W_i$ is the thickness of a layer and $v_i^S$, its shear wave velocity. For the sake of simplicity, at i=0, the resonator area—that is, the piezoelectric layer and the electrodes—is described by a single layer. The longitudinal layers of the acoustic mirror, located above the shear mirror, are indicated by i=1, ... $N_L$, beginning with the uppermost position.

From the condition that the phase of the mode of the TS2'/UX $N_L/4$ type is overall $(N_L+4)\pi/2$, it is possible to determine the resonance frequency $f_{N_L}$ of this mode:

$$f_{N_L} = \frac{\frac{N_L+4}{4}}{\sum_{j=0}^{N_L} \frac{W_i}{v_i^S}}.$$

The thicknesses of the mirror layers are preferably selected as a function of their material in such a way that they are approximately one quarter-wavelength of the longitudinal wave at the resonance frequency $f_{TE1}$ of the longitudinal mode TE1. This is given by the following equation:

$$W_i = \frac{v_i^L}{4f_{TE1}} \chi_i, i = 1, \ldots, N_L,$$

where $v_i^L$ an is the velocity of the longitudinal wave. The parameter $X_i$ describes deviations from the ideal longitudinal layer thickness at $X_i=1$.

The layer thickness of the resonator is preferably selected in such a way that it is a half wavelength of the longitudinal weave. In this way, the following is valid:

$$W_0 = \frac{v_0^L}{2f_{TE1}} \chi_0,$$

where $v_o^L$ is the velocity of the longitudinal wave in the resonator and $X_0$ describes the deviation from the ideal longitudinal layer thickness. The cut-off frequency of the TS2'/UX $N_L/4$ mode is produced as:

$$f_{N_L} = \frac{N_L+4}{\sum_{i=1}^{N_L} \frac{v_i^L}{v_i^S} \chi_i + 2\frac{v_0^L}{v_0^S} \chi_0} f_{TE1}.$$

With this formula, it is possible to substantiate why the resonance frequency of the TS2'/UX $N_L/4$ mode falls with increasing depth of the shear mirror and particularly with an increasing number $N_L$ of the longitudinal layers. The condition of decreasing frequency is: $f_{N_L+1}<f_{N_L}$. Consequently, the following is valid:

$$\frac{v_{N_L+1}^L}{v_{N_L+1}^S} \chi_{N_L+1} > \frac{f_{TE1}}{f_{N_L}}.$$

Since, as a rule, only modes whose resonance frequency is in the vicinity of that of the main TE1 mode are relevant, $f_{TE1} \approx f_{N_L}$ can be assumed. Therefore, the following is valid:

$$\frac{v_{N_L+1}^L}{v_{N_L+1}^S} \chi_{N_L+1} > 1.$$

For tungsten, $SiO_2$ or Aln, $$\frac{v^L}{v^S}$$

1.83, 1.59, and 1.72 is valid. Therefore, $f_{N_L+1} < f_{N_L}$, is always valid, if $x_{N_L+1}=1$—that is, if the thickness of the $(N_L+1)$th layer is exactly one quarter-wavelength of the longitudinal wave. In fact, this equation is also valid for smaller $x_{N_L+1}$ up to approximately $X_{N_L+1} \approx 0.6$.

The most important results can be summarized as follows:

1) The cut-off frequency of the shear modes is sensitive to a variation of the layer thicknesses in the resonance space—that is, above the shear mirror. The sensitivity to the absolute variation in the layer thickness is thereby inversely proportional to the shear wave velocity of the layer. An increase in the thickness layer thereby leads to a lowering of the frequency.

2) The addition of another mirror layer above the shear mirror, that is not identical to a shear mirror layer, brings about the downward displacement of the shear mirror by one layer, which produces the lowering of the resonance frequency of the TS2 mode.

The findings, attained with the aid of this simple model, for the dependence of the resonance frequency of the TS2'/UX $N_L/4$ mode on the number and the thickness of the mirror layers can be transferred also to higher modes, such as TS2'/UX $(N_L+2)/4$.

Figure 6:
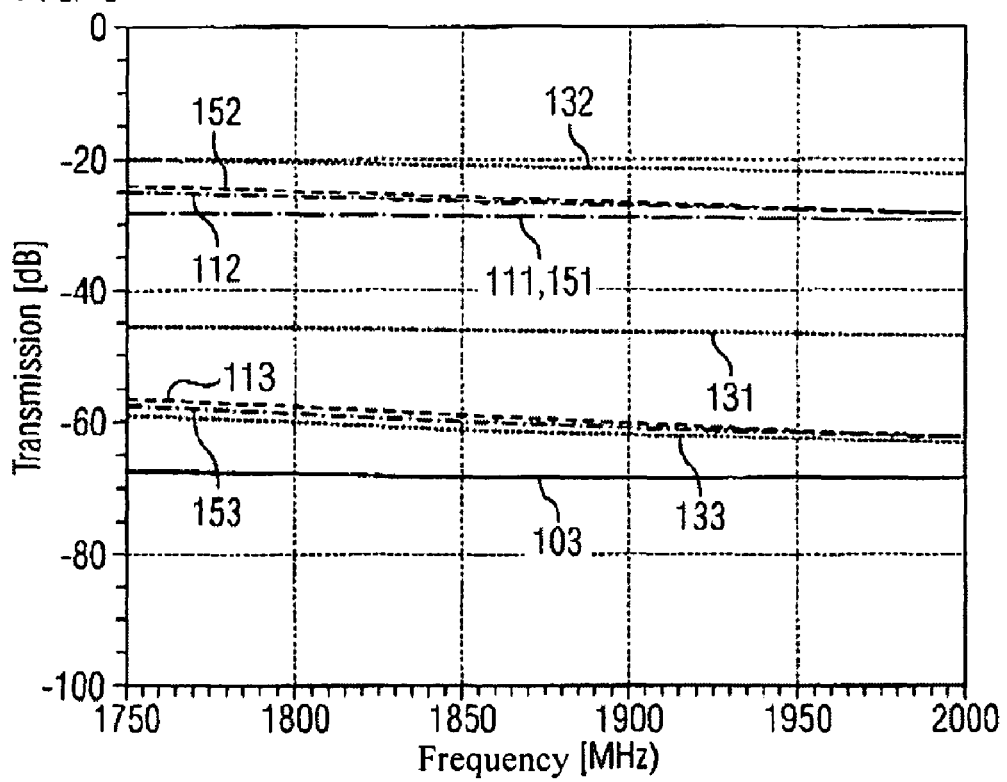
FIG. 6, frequency dependence of the transmission coefficient of the partial mirror and the total resonator stack for the longitudinal main TE1 mode, comparison with a resonator stack without a shear mirror (simulation)

FIG. 6 shows the frequency dependence of the transmission coefficient of the longitudinal mirror AS1, the shear mirror AS2, and the resonator stack, which is below the piezoelectric layer—preferably, AlN, for the longitudinal main TE1 mode, in comparison with the transmission coefficient 103 of the known stack (see Table 1) with a longitudinal mirror, consisting of four mirror layers and without a shear mirror.

The transmission of the longitudinal wave by the longitudinal mirror AS1 with the resonator with the first, second, and third stacks is designated in FIG. 6 as 111, 131, and 151. The transmission of the longitudinal wave by the shear mirror AS2 with the resonator with the first, second, and third stacks is designated as 112, 132, and 152. The transmission of the longitudinal wave TE1 by the complete mirror with the resonator with the first, second, and third stacks is designated as 113, 133, and 153. The curves 103, 113, 133, and 153 refer to the complete resonator stack—that is, the resonator area with the acoustic mirror.

A known stack that does not contain a shear mirror is characterized by the curve 103. In this case, the longitudinal wave TE1 is damped overall by ca. 67.5 dB in the resonator stack in the passage direction. By the longitudinal mirror AS1, this wave is damped, depending on the structure of the resonator stack, at 1880 MHz, by ca. 28 dB (in the first and third stacks) and 46 dB (in the second stack). The damping of the longitudinal wave by the shear mirror AS2 in the passage direction is better than 20 dB, so that the shear mirror also contributes to the damping of this wave.

The known resonator stack with a longitudinal mirror but without the shear mirror exhibits a relatively high damping of the longitudinal wave of ca. 68 dB. For the complete resonator stack, which comprises a shear mirror AS2, a relatively high damping of the longitudinal wave is attained at the resonance frequency—better than 60 dB for all resonator stacks.

Figure 7:
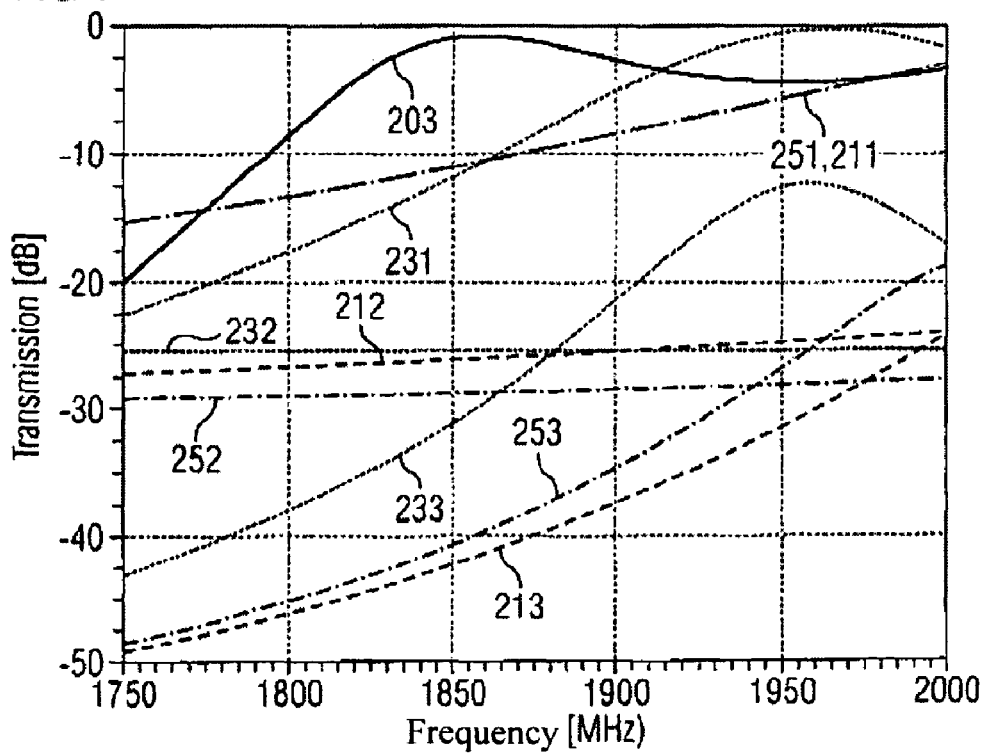
FIG. 7, frequency dependence of the transmission coefficient of the partial mirror and the total resonator stack for the TS2 shear mode, comparison with a resonator stack without a shear mirror (simulation)

FIG. 7 shows the frequency dependence of the transmission coefficient of the partial mirrors AS1, AS2, and the area of the resonator stack that lies below the piezoelectric layer—preferably AlN for the shear mode TS2 in comparison with the transmission coefficient 203 of a known resonator stack that does not contain a shear mirror.

The transmission of the shear wave by the longitudinal mirror AS1 with the resonator with the first, second, and third stacks is designated as 211, 231, and 251. The transmission of the shear wave by the shear mirror AS2 with the resonator with the first, second, and third stacks, is designated as 212, 232, and 252. The transmission of the shear wave TS2 by the complete mirror with the resonator with the first, second, and third stacks is designated as 213, 233, and 253. The curves 203, 213, 233, and 253 refer to the complete resonator stack—that is, the resonator area with the acoustic mirror.

In the absence of the shear mirror (see curve 203), a larger part of the shear wave TS2, as a whole, is allowed through in the direction of the substrate SU at the resonance frequency of the resonator (in this example, ca. 1880 MHz) by the resonator stack. This is changed very greatly after the introduction of the shear mirror, since the shear wave is thereby locked in and can no longer escape into the substrate.

By the longitudinal mirror AS1, the shear wave is damped by ca. 8 to 10 dB at 1880 MHz in the passage direction and depending on the structure of the resonator stack, wherein a relatively large part of the energy of the shear wave is still lost. The damping of the shear wave by the shear mirror AS2 in the passage direction is better than 25 dB (at 1880 MHz). For the complete resonator stack that comprises a shear mirror AS2, a relatively low transmission of the shear wave, which is 40 dB, 25.5 dB, and 38 dB for the first, second, or third resonator stacks, is achieved at this frequency.

It has been shown that the maximum reflection for the shear wave is effected by the arrangement of two lowermost mirror layers in the first resonator stack. Since the second lowermost mirror layer (made of $SiO_2$) in the second and third stacks is not designed for the preferred reflection of the shear wave, the reflectivity of this mirror layer arrangement drops. This loss is partially compensated in the complete mirror in that the insulating layer in the second and third stacks is selected to have a layer thickness suitable for the preferred reflection of the shear wave TS2. The acoustic mirror contained in the second and third stacks can therefore be considered as a mirror with a total of five mirror layers, among them, two shear mirror layers.

In FIG. 8A, the dispersion curves for the longitudinal modes TE1 and for the shear modes TS2 are shown that can propagate in the first, second, and third resonator mirrors with a total of four mirror layers. The curves for the longitudinal modes in the known first, second, and third resonator stacks are thereby designated as TE1-0, TE1-1, TE1-3, and TE1-5. The curves for the shear modes in the first, second, and third resonator mirrors are designated as TS2-1, TS2-3, TS2-5. It can be seen on curve TE1-0 that the known stack has an abnormal dispersion of TE1, whereas in the first, second, and third stacks, a normal dispersion of TE1 was achieved by introduction of the shear mirror. The cut-off frequency $f_{c,\,TS2-1}$, $f_{c,\,TS2-3}$ and $f_{c,TS2-5}$ of the shear modes TS2-1, TS2-3, and TS2-5 is preferably selected in such a way that it is outside the bandwidth of the filter comprising such resonators. This is the case in FIG. 8A, for example, for the frequencies $f_{c,\,TS2-3}$ and $f_{c,\,TS2-5}$ in the first and second stacks.

In the second and third stacks, the thickness of the insulating layer IS is essentially selected to be equal to the thickness of a shear mirror layer AS21, AS22, so that it can be correlated, in principle, with the shear mirror AS2. A thickness of the insulating layer IS selected in this manner has the advantage that it reflects a part of the shear wave that has penetrated the layers AS21, AS22 of the shear mirror.

In the first resonator stack, the thickness of the second lowest mirror layer (made of silicon dioxide) is essentially equal to $\lambda_{TS2}/4$. In order to lower the cut-off frequency $f_{c,TS2}$ of the shear mode, the thickness of the second lowest mirror layer (made of silicon dioxide) was increased in the third resonator stack to a value which is between the thickness of the mirror layers of the shear mirror and the longitudinal mirror. In order to effect a further lowering of the cut-off frequency $f_{c,TS2}$ of the shear mode, the thickness of the second lowest mirror layer (made of silicon dioxide) in the second resonator stack was essentially increased to the value of the thickness of the mirror layers AS11, AS12 of the longitudinal mirror AS1. The lowest cut-off frequency $f_{c,TS2}$ of the shear mode TS2 was therefore achieved with the largest resonance space provided for this mode in the resonator stack.

With the dropping cut-off frequency $f_{c,TS2}$, the slope of the dispersion curve also declines, wherein the lowest slope is achieved for the second stack.

Since the longitudinal mode is already reflected back to a great extent by the upper partial mirror, the addition of another partial mirror, which is designed for the reflection of the shear wave, brings about almost no change in the resonator frequency $f_R$ of the resonator, depending on the stack variant.

A resonator stack with a complete mirror consisting of eight mirror layers is shown in FIG. 9. The first partial mirror AS1 thereby consists of four first mirror layers and the second partial mirror AS2, of four second mirror layers. The first mirror is a sequence of the first mirror layers with a low and high acoustic impedance. The second mirror is a sequence of the second mirror layers with a low and high acoustic impedance. Otherwise, the description of FIGS. 1 and 2 applies for this resonator stack.

The invention claimed is:

1. A resonator operating with bulk acoustic waves, the resonator comprising:
   a resonator stack comprising:
      a resonator area configured to allow propagation of an acoustic main mode and an acoustic secondary mode; and
      an acoustic mirror comprising:
         a first partial mirror for locking in the acoustic main mode in the resonator area, and
         a second partial mirror for locking in the acoustic secondary mode in the resonator area at the resonance frequency of the resonator, the first partial mirror being between the resonator area and the second partial mirror.

2. The resonator according to claim 1, wherein:
   the resonator stack defines a lateral plane and a lateral direction parallel to the lateral plane, and a longitudinal direction that extends in a thickness direction of the resonator stack the acoustic main mode is an acoustic wave polarized in the longitudinal direction; and
   the acoustic secondary mode is an acoustic wave polarized in the lateral direction.

3. The resonator of claim 1, wherein:
   at the resonance frequency of the resonator, a wave antinode of the acoustic main mode appears at an interface of the resonator area facing away from the acoustic mirror, and
   a successive wave antinode of the acoustic main mode appears about at the interface of the resonator area facing the acoustic mirror;
   at the resonance frequency of the resonator, a wave antinode of the acoustic secondary mode appears at the interface of the resonator area facing away from the acoustic mirror, and the wave antinode after the next of the acoustic secondary mode mainly appears about at the interface of the resonator area facing the acoustic mirror.

4. The resonator of claim 1, further comprising:
   a substrate supporting the resonator stack;
   wherein the second partial mirror is between the first partial mirror and the substrate.

5. The resonator of claim 1, wherein the first partial mirror comprises at least one first mirror layer having a thickness of about $(2n+1)\lambda_L/4$, where $\lambda_L$ is the wavelength of the acoustic main mode for the material of this layer at the resonance frequency of the resonator and n is a whole number.

6. The resonator of claim 5, wherein:
   two wave antinodes of the acoustic secondary mode appear in the resonator area, and
   an additional wave antinode of the acoustic secondary mode appears in the first mirror layer facing the resonator area.

7. The resonator of claim 5, wherein the first partial mirror comprises at least two successive first mirror layers.

8. The resonator of claim 7, wherein a size of a resonating cavity for the acoustic secondary mode is established by the number, layer thicknesses, and material of the first mirror layers such that a cut-off frequency $f_{c,S} = f_S (k_{x,y} = 0)$ of the acoustic secondary mode is below the resonance frequency of the resonator.

9. The resonator of claim 7, wherein a size of a resonating cavity available for the acoustic secondary mode is established by the number of the first mirror layers, the layer thicknesses, and the material of the first mirror layers such that the cut-off frequency $f_{c,S} = f_S (k_{x,y} = 0)$ of the acoustic secondary mode is above the resonance frequency of the resonator.

10. The resonator of claim 1, wherein:
    in the acoustic main mode, a quarter-wave is formed in the longitudinal direction at the resonance frequency of the acoustic main mode in the resonator area, and
    in the acoustic secondary mode a half-wave is formed at the resonance frequency of the acoustic secondary mode in the resonator area.

11. The resonator of claim 1, further comprising:
    at least one intermediate layer between the first and the second partial mirrors, wherein a thickness of the intermediate layer is between a thickness of a layer of the first partial mirror layer and a thickness of a layer of the second partial mirror layer.

12. The resonator of claim 11, wherein at least one of the first and second partial mirrors layers comprises alternatingly arranged mirror layers with a high acoustic impedance and low acoustic impedance.

13. The resonator of claim 1, wherein:
    the first partial mirror comprises at least one first mirror layer, having a thickness of about $(2n+1)\lambda_L/4$, where $\lambda_L$ is the wavelength of the acoustic main mode for the material of the layer at the resonance frequency of the resonator and n is a whole number; and
    the first partial mirror comprises an additional first mirror layer that faces the resonator area, wherein the additional first mirror layer has a low acoustic impedance and the thickness of the additional first mirror layer differs from the quarter-wavelength of the acoustic main mode.

14. The resonator of claim 1, further comprising an electrically insulating layer between the acoustic mirror and the substrate.

15. The resonator of claim 1, wherein the second partial mirror comprises at least a second mirror layer having a thickness of about $(2m+1)\lambda_S/4$, where $\lambda_S$ is the wavelength of the acoustic secondary mode for the material of this layer at the resonance frequency of the resonator and m is a whole number.

16. The resonator of claim 15,
wherein the number of the second mirror layers, the layer thicknesses of the second mirror layers, and the material of the second mirror layers are configured such a wave node or a wave antinode of the acoustic secondary mode, at the cut-off frequency $f_{c,S}$ of the acoustic secondary mode is essentially at the interface of the second partial mirror facing the resonator area.

17. The resonator of claim 16, wherein the layer thicknesses of the second mirror layers are selected as a function of the material of a respective layer of the second mirror layers such that a wave node of the standing wave of the acoustic secondary mode appears at the interface of the second mirror layer and an overlying mirror layer if the acoustic wave of the overlying mirror layer is incident with a lower impedance than that of the second mirror layer.

18. The resonator of claim 17, wherein the overlying mirror layer comprises a first mirror layer of the first partial mirror.

19. The resonator of claim 17, wherein the overlying mirror layer comprises an intermediate layer between the first and the second partial mirrors, the intermediate layer having a thickness between a thickness of a first mirror layer of the first partial mirror and the second mirror layer.

20. The resonator according to claim 16, wherein the layer thicknesses of the second mirror layers are selected, as a function of the material of a respective layer of the second mirror layers such that a wave antinode of the standing wave of the acoustic secondary mode appears at the interface of the respective second mirror layer and an overlying mirror layer if the respective second mirror layer has a lower acoustic impedance than the overlying mirror layer.

21. The resonator of claim 20, wherein the overlying mirror layer comprises a first mirror layer of the first partial mirror.

22. The resonator of claim 20, wherein the overlying mirror layer comprises an intermediate layer between the first and the second partial mirrors the intermediate layer having a thickness between a thickness of a first mirror layer of the first partial mirror and the second mirror layer.

23. The resonator of claim 15, wherein the second partial mirror comprises at least two successive second mirror layers.

24. The resonator of claim 15, wherein:
the resonator area and the first partial mirror form an arrangement having a dispersion behavior that is monotonically decreasing; and
the number of the second mirror layers, the layer thicknesses of the second mirror layers, and the material of the second mirror layers are configured such that the dispersion behavior of the resonator is monotonically increasing.

25. The resonator of claim 15, wherein:
the first partial mirror has four first mirror layers with alternating high acoustic impedance and low acoustic impedance, and
the second partial mirror has four second mirror layers with alternatingly high and low acoustic impedance.

26. The resonator of claim 15, wherein:
a reflection coefficient for the acoustic secondary mode in the second partial mirror is greater than a reflection coefficient for the acoustic secondary mode in the first partial mirror, and
a transmission coefficient for the acoustic secondary mode in the second partial mirror is smaller by at least 10dB than a transmission coefficient for the acoustic secondary mode in the first partial mirror.

* * * * *

UNITED STATES PATENT AND TRADEMARK OFFICE
CERTIFICATE OF CORRECTION

PATENT NO. : 7,795,998 B2
APPLICATION NO. : 12/158210
DATED : September 14, 2010
INVENTOR(S) : Markus Mayer et al.

It is certified that error appears in the above-identified patent and that said Letters Patent is hereby corrected as shown below:

Claim 2, Line 1-5, Column 21, Lines 52-59 –

Delete - "2. The resonator according to claim 1, wherein:
the resonator stack defines a lateral plane and a lateral direction parallel to the lateral plane, and
    a longitudinal direction that extends in a thickness direction of the resonator stack the
    acoustic main mode is an acoustic wave polarized in the longitudinal direction; and
the acoustic secondary mode is an acoustic wave polarized in the lateral direction."

Insert -- 2. The resonator according to claim 1, wherein:
the resonator stack defines a lateral plane and a lateral direction parallel to the lateral plane, and a longitudinal direction that extends in a thickness direction of the resonator stack;
the acoustic main mode is an acoustic wave polarized in the longitudinal direction; and
the acoustic secondary mode is an acoustic wave polarized in the lateral direction. --, therefore.

Claim 5, Column 22, Line 14: delete "$(2n+1),\lambda_L/4$," and insert -- $(2n+1)\lambda_L/4$, --, therefore.

Column 22, Line 50: In Claim 11, after "mirror" delete "layer".

Column 22, Line 51: In Claim 11, delete "mirror layer." and insert -- mirror. --, therefore.

Column 22, Line 53: In Claim 12, after "mirrors" delete "layers".

Column 23, Line 6: In Claim 15, delete "$(2m+1)\lambda_S/4)$," and insert -- $(2m+1)\lambda_S/4$, --, therefore.

Signed and Sealed this

Seventh Day of December, 2010

David J. Kappos
*Director of the United States Patent and Trademark Office*